(12) United States Patent
Yamaguchi et al.

(10) Patent No.: US 12,381,112 B2
(45) Date of Patent: Aug. 5, 2025

(54) METHOD OF MANUFACTURING SEMICONDUCTOR DEVICE

(71) Applicant: Tokyo Electron Limited, Tokyo (JP)

(72) Inventors: Shimpei Yamaguchi, Tokyo (JP); Kiyotaka Imai, Tokyo (JP); Atsushi Tsuboi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 579 days.

(21) Appl. No.: 17/654,838

(22) Filed: Mar. 15, 2022

(65) Prior Publication Data

US 2022/0199463 A1 Jun. 23, 2022

Related U.S. Application Data

(63) Continuation-in-part of application No. PCT/JP2020/033707, filed on Sep. 7, 2020.

(30) Foreign Application Priority Data

Sep. 19, 2019 (JP) .................. 2019-170779

(51) Int. Cl.
*H01L 21/768* (2006.01)
*H01L 23/522* (2006.01)

(52) U.S. Cl.
CPC .... *H01L 21/76816* (2013.01); *H01L 23/5226* (2013.01); *H01L 21/76819* (2013.01)

(58) Field of Classification Search
CPC ........... H01L 21/76816; H01L 23/5226; H01L 21/76819; H01L 21/76831; H01L 21/28; H01L 21/76897; H01L 21/8234; H01L 27/088; H01L 29/78
See application file for complete search history.

(56) References Cited

U.S. PATENT DOCUMENTS

| 9,461,143 B2 | 10/2016 | Pethe et al. | |
| 2008/0305627 A1* | 12/2008 | Maekawa | H10B 12/485 257/E21.577 |
| 2018/0182668 A1 | 6/2018 | Xie et al. | |

FOREIGN PATENT DOCUMENTS

| KR | 10-2008-0029565 A | 4/2008 |
| KR | 10-2016-0085992 A | 7/2016 |

* cited by examiner

*Primary Examiner* — Mohammad A Rahman
(74) *Attorney, Agent, or Firm* — Armstrong Teasdale LLP

(57) ABSTRACT

A method of manufacturing a semiconductor device includes: forming a first film containing carbon over a silicon nitride film and a first conductive film; forming a first silicon oxide film surrounding the first film over the silicon nitride film and the first conductive film; removing the first film to form, in the first silicon oxide film, a first opening that exposes at least a part of the silicon nitride film and at least a part of the first conductive film; and forming a second conductive film on and in contact with the first conductive film in the first opening.

11 Claims, 31 Drawing Sheets

A----------A'

B--------------B'

METHOD OF MANUFACTURING SEMICONDUCTOR DEVICE

CROSS-REFERENCE TO RELATED APPLICATION

This application is a bypass continuation-in-part application of international application No. PCT/JP2020/033707 having an international filing date of Sep. 7, 2020 and designating the United States, the international application being based upon and claiming the benefit of priority from Japanese Patent Application No. 2019-170779, filed on Sep. 19, 2019, the entire contents of which are incorporated herein by reference.

TECHNICAL FIELD

The following disclosure relates to a method of manufacturing a semiconductor device.

BACKGROUND

Patent Literature 1 discloses a technique of reducing a cell area as a so-called contact over active gate (COAG) structure in which a contact to a gate electrode is disposed on an active region.

PRIOR ART DOCUMENT

Patent Document

Patent Literature 1: U.S. Pat. No. 9,461,143

SUMMARY

A method of manufacturing a semiconductor device according to an aspect of the present disclosure includes: forming a first film containing carbon over a silicon nitride film and a first conductive film; forming a first silicon oxide film surrounding the first film over the silicon nitride film and the first conductive film; removing the first film to form, in the first silicon oxide film, a first opening that exposes at least a part of the silicon nitride film and at least a part of the first conductive film; and forming a second conductive film on and in contact with the first conductive film in the first opening.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a method of manufacturing a semiconductor device disclosed in the present application will be described in detail with reference to the drawings. The method of manufacturing a semiconductor device disclosed herein is not limited by the present embodiment. In the present disclosure, the ordinal numerals attached as "first", "second," and the like are used for the sake of convenience to avoid confusion of constituent elements. Therefore, even when words with ordinal numerals are given in the present disclosure, different ordinal numerals may be given or ordinal numerals may be omitted in the claims or the like.

Incidentally, in a case of a leading-edge logic device, reduction of a cell area is an urgent problem. However, in a case of using a selective etching when forming a via connected to a gate electrode or a via connected to a trench contact, if the selectivity of the etching is not sufficient, a short circuit may occur, which may deteriorate the yield.

Therefore, a technique of suppressing short circuit from occurring is expected.

First Embodiment

A method of manufacturing a semiconductor device according to a first embodiment will be described. In the following embodiment, a process of manufacturing a field effect transistor (FET) of a logic device will be described as an example by taking a semiconductor device as a logic device. Examples of the logic device include a microprocessor such as a central processing unit (CPU).

Figure 1:
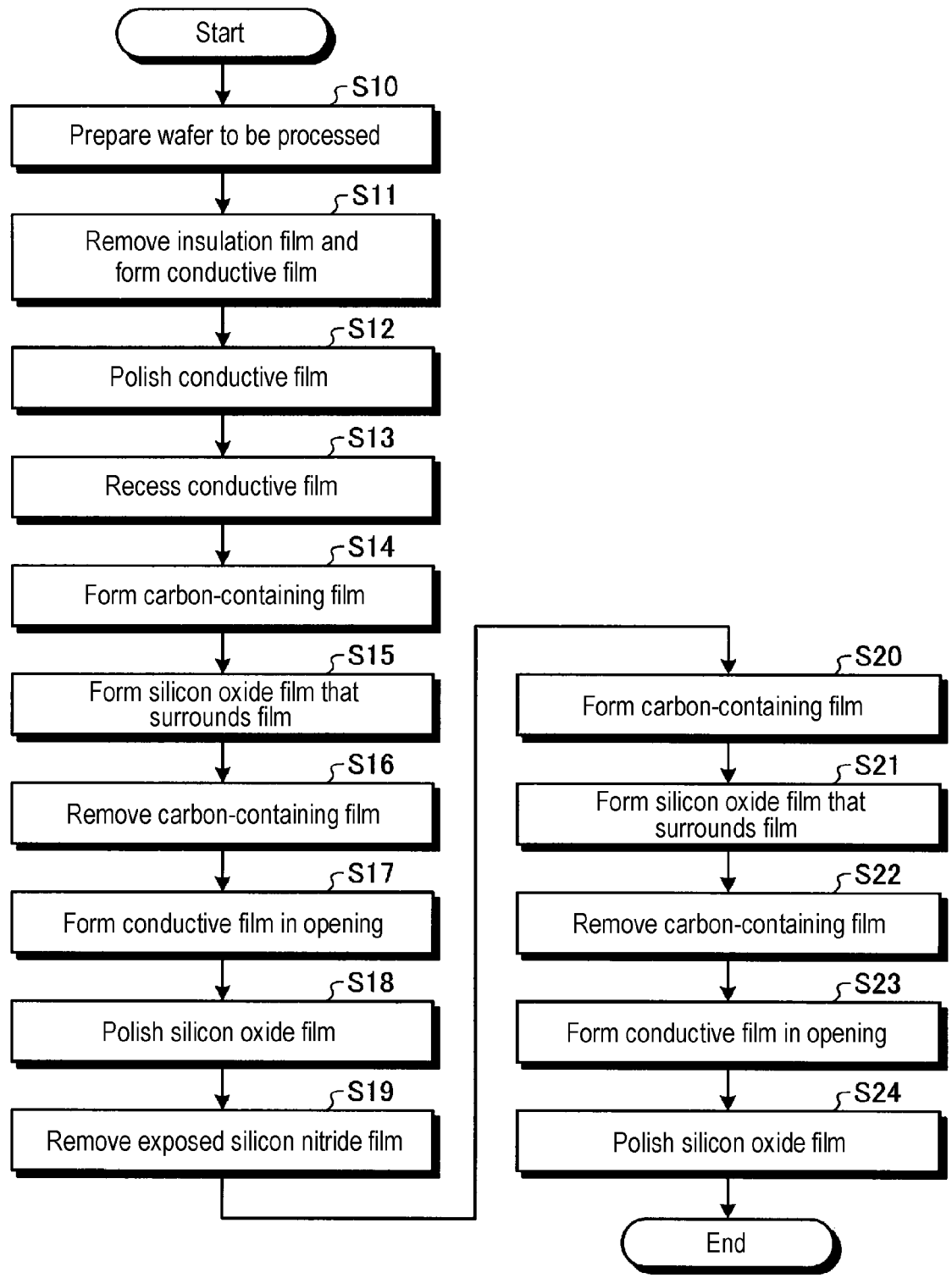
FIG. 1 is a flowchart illustrating an example of a method of manufacturing a semiconductor device according to a first embodiment.

FIG. 1 is a flowchart illustrating an example of a method of manufacturing a semiconductor device according to the first embodiment. FIG. 1 illustrates a procedure of forming contacts with an active region and a gate electrode of the FET, respectively. In the present embodiment, a semiconductor device is manufactured on a wafer W by the procedure shown in the flowchart of FIG. 1. Hereinafter, an example of a method of manufacturing a semiconductor device will be described with reference to FIGS. 2A to 16B.

Figure 2A:
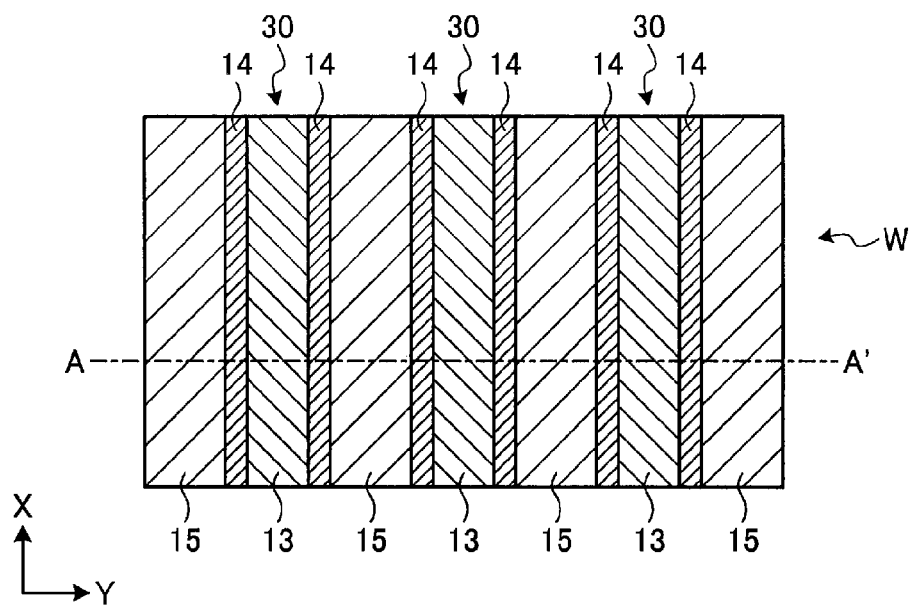
FIG. 2A is a view illustrating an example of the method of manufacturing a semiconductor device according to the first embodiment.
Figure 2B:
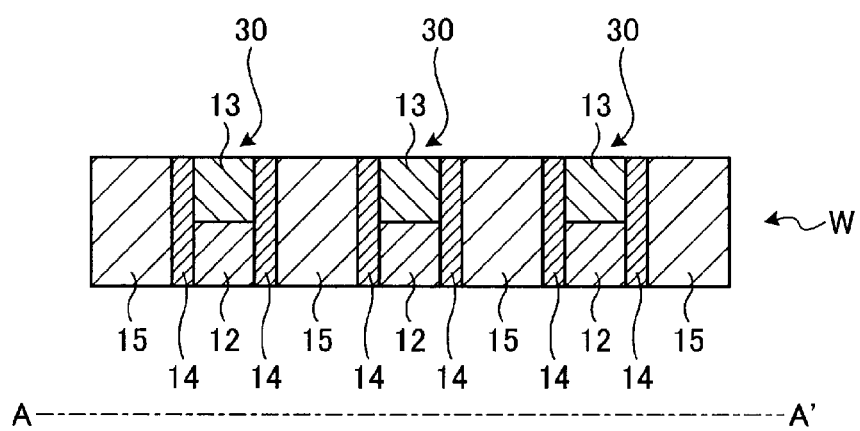
FIG. 2B is a cross-sectional view taken along line A-A' of the wafer illustrated in FIG. 2A.

First, a wafer W to be processed is prepared (step S10). The wafer W to be processed has, for example, a structure as illustrated in FIGS. 2A and 2B. FIG. 2A is a view illustrating an example of a method of manufacturing a semiconductor device according to the first embodiment. FIG. 2A is a top view illustrating an example of the wafer W on which the semiconductor device is manufactured. FIG.

2B is a cross-sectional view taken along line A-A' of the wafer W illustrated in FIG. 2A.

The wafer W is laminated with a conductive film 12 of tungsten (W) or the like. A silicon nitride (SiN) film 13 is laminated as an insulation film on the conductive film 12.

Figure 2C:
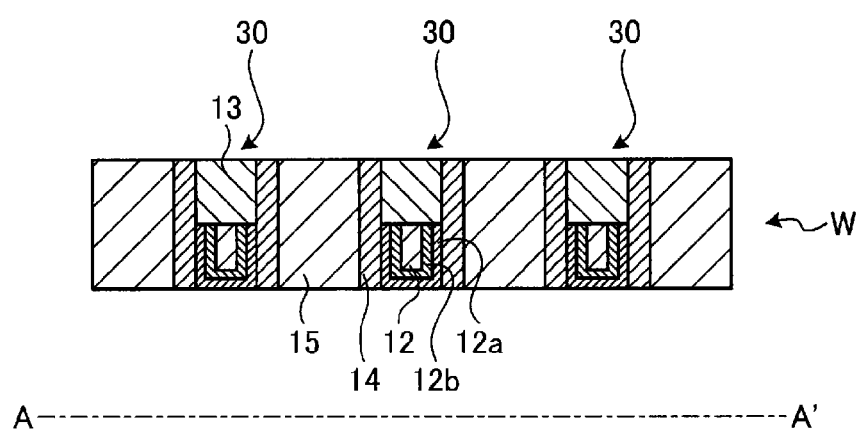
FIG. 2C is a cross-sectional view illustrating another example of the configuration of the semiconductor device.

Side surfaces of the conductive film 12 and the silicon nitride film 13 are covered with insulating spacers 14. The spacer 14 is formed of, for example, an insulating material such as SiOCN. For example, as illustrated in FIGS. 2A and 2B, structures 30 each having the conductive film 12 and the silicon nitride film 13 covered with the spacers 14 are disposed at a predetermined interval in a y-axis direction, and each of the structures 30 extends in an x-axis direction. Further, an insulation film 15 is embedded between the structures 30 adjacent to each other in the y-axis direction. The insulation film 15 is formed of, for example, a silicon oxide such as a $SiO_2$. On the lower layer of the conductive film 12, the spacer 14, and the insulation film 15 of the wafer W, for example, an active region which is a semiconductor such as silicon into which p-type or n-type impurities are introduced, and an insulating region made of, for example, a silicon oxide, are formed for each region of the cell of the FET. The semiconductor device fabricated on the wafer W may have the following structure. FIG. 2C is a cross-sectional view taken along line A-A' of the wafer W illustrated in FIG. 2A. FIG. 2C is a cross-sectional view illustrating another example of the configuration of the semiconductor device. In the wafer W illustrated in FIG. 2C, the same components as those in FIG. 2B are denoted by the same reference numerals. In this configuration, the periphery (the bottom surface and the side surface) of the conductive film 12 is covered with a laminated structure of films 12a and 12b. The film 12a is formed of, for example, $HfO_2$ and functions as a gate insulation film. For the film 12a, in addition to the $HfO_2$, for example, $ZrO_2$ or $HfZrO_2$ can be used. The film 12b is formed of, for example, TiN, and serves as a metal film for setting a work function. Examples of other materials that can be used for the film 12b include TiAlN. The material used for the film 12b varies depending on a conductivity type of a transistor to be formed. For example, in the case of a PMOSFET, TiN can be used, and in the case of an NMOSFET, TiAlN can be used. The conductive film 12 is formed of, for example, W, and is used as a low resistance metal film for the purpose of lowering the overall resistance. In this way, the configuration illustrated in FIG. 2C can be applied to both the PMOSFET and the NMOSFET. The conductive film 12 to be described in FIG. 3A and the subsequent drawings may have the configuration as illustrated in FIG. 2C.

Figure 3A:
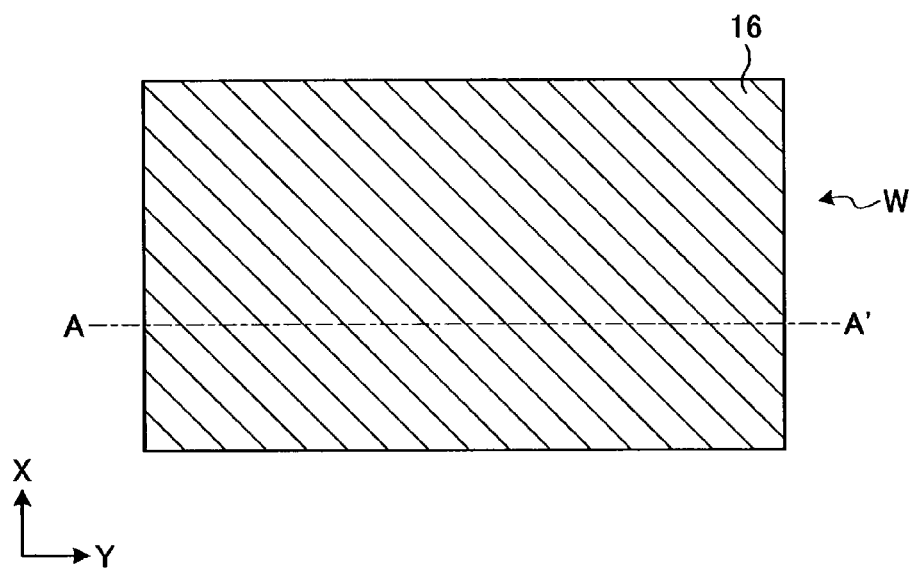
FIG. 3A is a view illustrating an example of the method of manufacturing a semiconductor device according to the first embodiment.
Figure 3B:
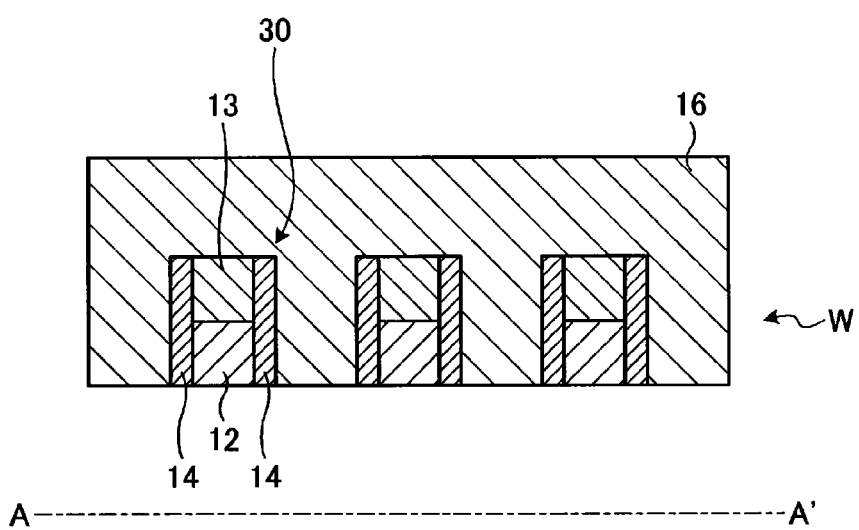
FIG. 3B is a cross-sectional view taken along line A-A' of the wafer illustrated in FIG. 3A.

Next, the insulation film 15 is removed, and a conductive film 16 is formed (step S11). The conductive film 16 is formed of, for example, a conductive metal material such as ruthenium (Ru) cobalt or tungsten. In the present embodiment, the conductive film 16 is formed of, for example, ruthenium. For example, the insulation film 15 is removed through dry etching or the like using a fluorocarbon gas. Then, for example, the conductive film 16 is formed by chemical vapor deposition (CVD) using dimethylbutadiene ruthenium tricarbonyl $(Ru(DMBD)(CO)_3)$ and an oxygen gas. Thereby, the wafer W enters a state illustrated in FIGS. 3A and 3B, for example. FIG. 3A is a view illustrating an example of the method of manufacturing a semiconductor device according to the first embodiment. FIG. 3A is a top view of the wafer W on which the conductive film 16 is formed. FIG. 3B is a cross-sectional view taken along line A-A' of the wafer W illustrated in FIG. 3A.

Figure 4A:
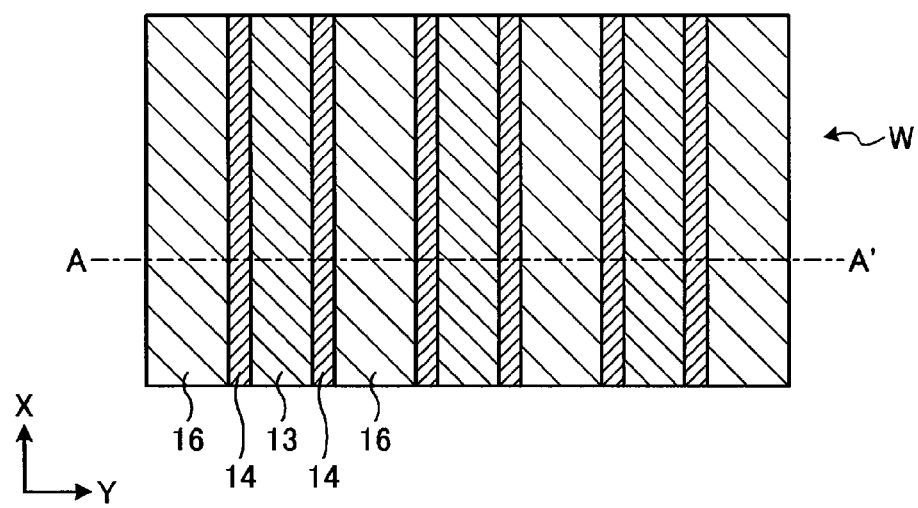
FIG. 4A is a view illustrating an example of the method of manufacturing a semiconductor device according to the first embodiment.
Figure 4B:
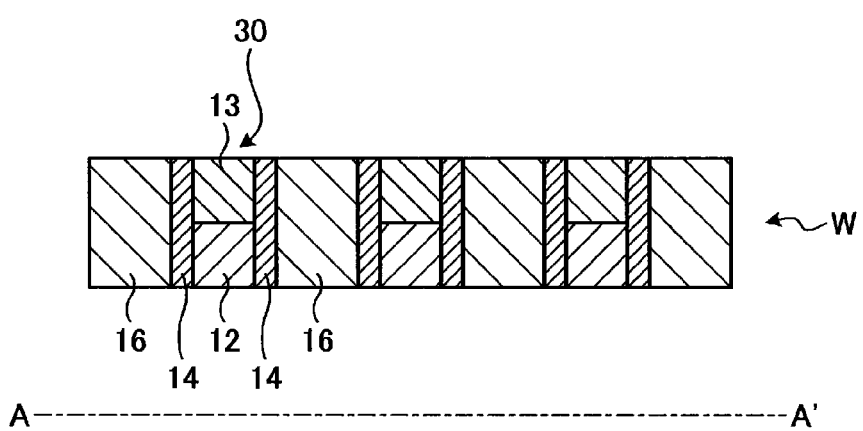
FIG. 4B is a cross-sectional view taken along line A-A' of the wafer illustrated in FIG. 4A.

Next, the conductive film 16 is polished to expose the upper surfaces of the silicon nitride film 13 and the spacer 14 (step S12). For example, the conductive film 16 is polished by chemical mechanical polishing (CMP) or the like until the upper surfaces of the silicon nitride film 13 and the spacer 14 are exposed. Thereby, the wafer W enters a state illustrated in FIGS. 4A and 4B, for example. FIG. 4A is a view illustrating an example of the method of manufacturing a semiconductor device according to the first embodiment. FIG. 4A is a top view of the wafer W in which the conductive film 16 is polished to expose the upper surfaces of the silicon nitride film 13 and the spacer 14. FIG. 4B is a cross-sectional view taken along line A-A' of the wafer W illustrated in FIG. 4A.

Figure 5A:
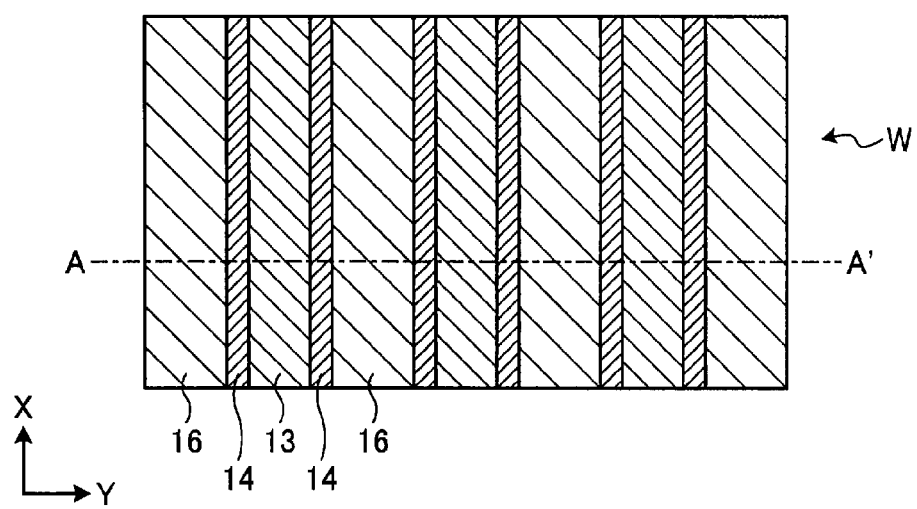
FIG. 5A is a view illustrating an example of the method of manufacturing a semiconductor device according to the first embodiment.
Figure 5B:
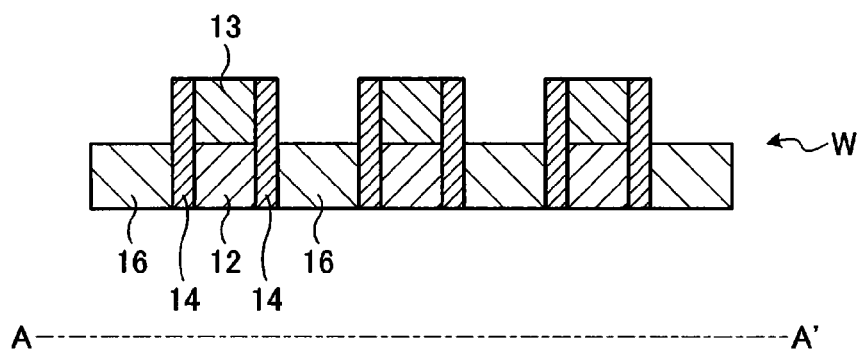
FIG. 5B is a cross-sectional view taken along line A-A' of the wafer illustrated in FIG. 5A.

Next, the conductive film 16 is recessed (step S13) such that the upper surface of the conductive film 16 is lower than the upper surfaces of the silicon nitride film 13 and the spacer 14. For example, the upper portion of the conductive film 16 is etched through dry etching or the like using an oxygen gas. Thereby, the wafer W enters a state illustrated in FIGS. 5A and 5B, for example. FIG. 5A is a view illustrating an example of the method of manufacturing a semiconductor device according to the first embodiment. FIG. 5A is a top view of the wafer W in which the conductive film 16 is recessed. FIG. 5B is a cross-sectional view taken along line A-A' of the wafer W illustrated in FIG. 5A.

Figure 6A:
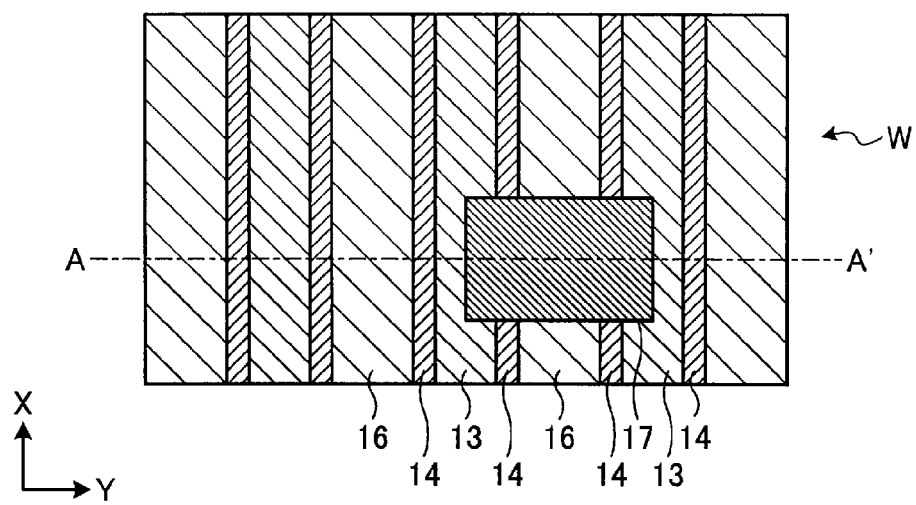
FIG. 6A is a view illustrating an example of the method of manufacturing a semiconductor device according to the first embodiment.
Figure 6B:
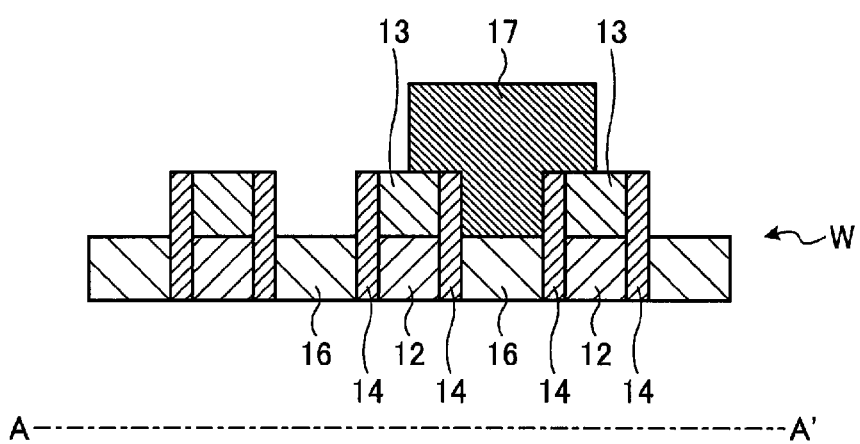
FIG. 6B is a cross-sectional view taken along line A-A' of the wafer illustrated in FIG. 6A.

Next, a carbon-containing film 17 is formed on the silicon nitride film 13 and the conductive film 16 (step S14). For example, the film 17 is formed at a position where a contact is formed between the silicon nitride film 13 and an active region on the conductive film 16. For example, a film is formed on the entire surfaces of the silicon nitride film 13 and the conductive film 16 by a carbon-containing hard mask or resist. Then, a mask film is formed on the formed film, and a pattern is formed in the mask film by photolithography such that the mask film remains in the region where the contact with the conductive film 16 is to be formed. Then, the carbon-containing film is patterned using the mask film as a mask, and the film 17 is formed at a position where a contact is to be formed. Thereby, the wafer W enters a state illustrated in FIGS. 6A and 6B, for example. FIG. 6A is a view illustrating an example of the method of manufacturing a semiconductor device according to the first embodiment. FIG. 6A is a top view of the wafer W on which the carbon-containing film 17 is formed. FIG. 6B is a cross-sectional view taken along line A-A' of the wafer W illustrated in FIG. 6A.

Figure 7A:
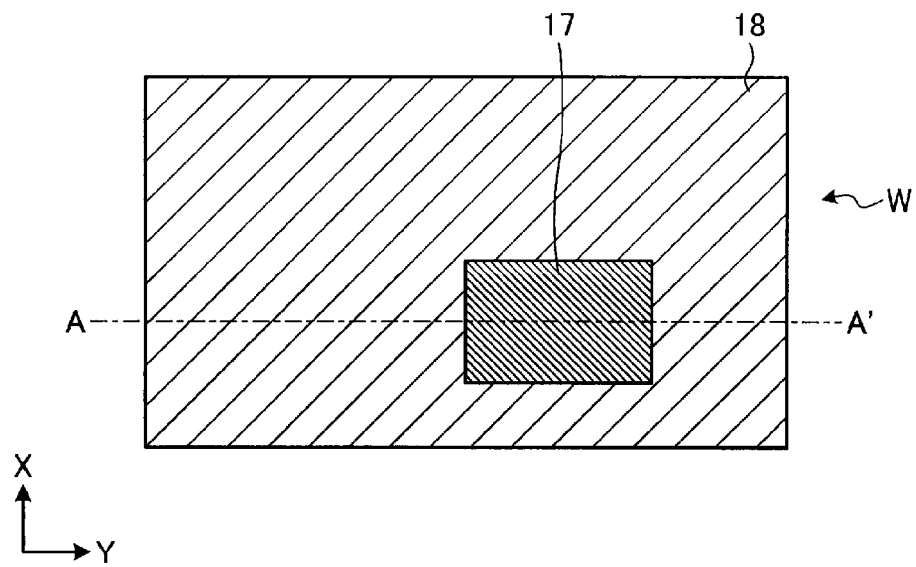
FIG. 7A is a view illustrating an example of the method of manufacturing a semiconductor device according to the first embodiment.
Figure 7B:
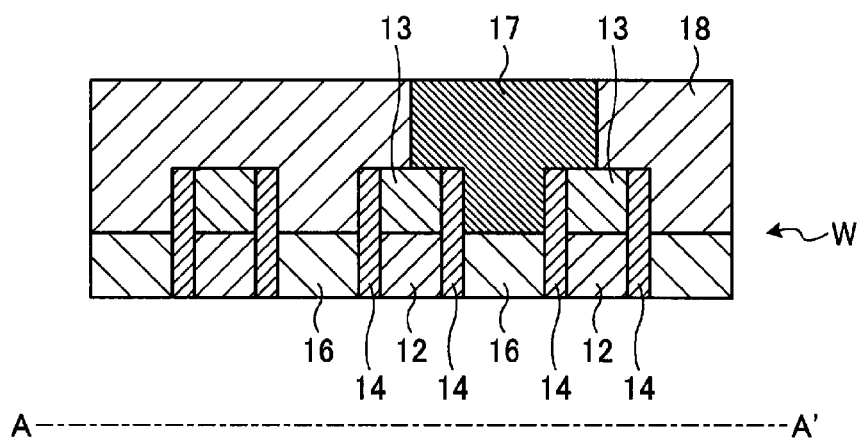
FIG. 7B is a cross-sectional view taken along line A-A' of the wafer illustrated in FIG. 7A.

Next, a silicon oxide film 18 that surrounds the film 17 is formed on the silicon nitride film 13 and the conductive film 16 (step S15). For example, the silicon oxide film 18 is formed on the entire surfaces of the silicon nitride film 13 and the conductive film 16 by CVD or coating. Then, the silicon oxide film 18 is polished by CMP or the like until the upper surface of the film 17 is exposed. Thereby, the wafer W enters a state illustrated in FIGS. 7A and 7B, for example. FIG. 7A is a view illustrating an example of the method of manufacturing a semiconductor device according to the first embodiment. FIG. 7A is a top view of the wafer W on which the silicon oxide film 18 surrounding the carbon-containing film 17 is formed. FIG. 7B is a cross-sectional view taken along line A-A' of the wafer W illustrated in FIG. 7A.

Figure 8A:
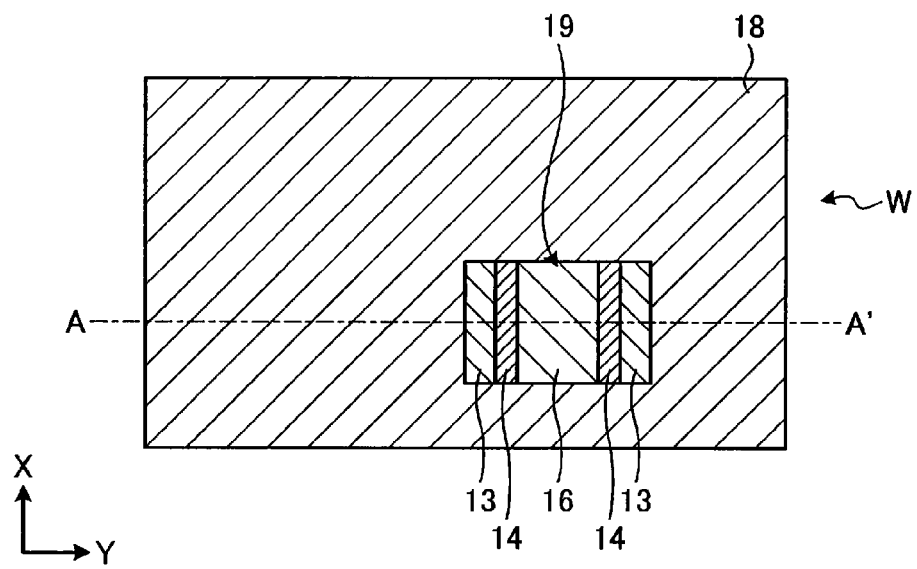
FIG. 8A is a view illustrating an example of the method of manufacturing a semiconductor device according to the first embodiment.
Figure 8B:
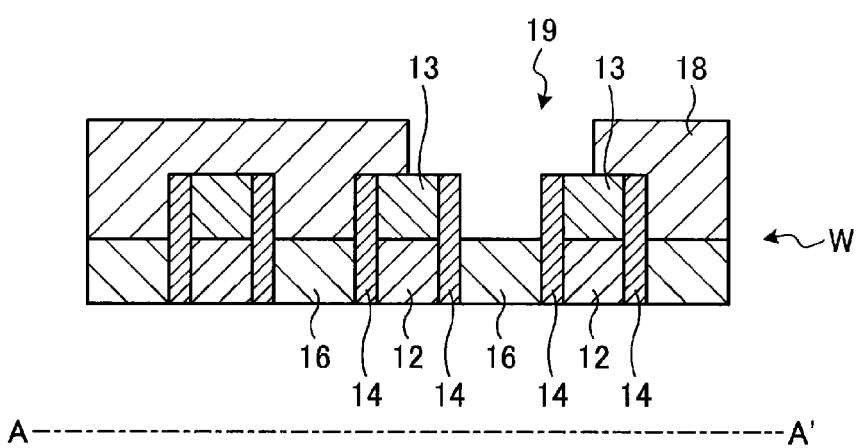
FIG. 8B is a cross-sectional view taken along line A-A' of the wafer illustrated in FIG. 8A.

Next, the carbon-containing film 17 is removed (step S16). For example, the carbon-containing film 17 is etched through dry etching or the like using an oxygen gas. Since the etching selectivity between the carbon-containing film 17 and the silicon oxide film 18 is sufficiently large, the removal of the film 17 may be performed by anisotropic etching or may be performed by isotropic etching. Thereby, the wafer W enters a state illustrated in FIGS. 8A and 8B, for example. FIG. 8A is a view illustrating an example of the method of manufacturing a semiconductor device according to the first embodiment. FIG. 8A is a top view of the wafer W from which the carbon-containing film 17 is removed. FIG. 8B is a cross-sectional view taken along line A-A' of the wafer W illustrated in FIG. 8A. Removal of the film 17 forms, in the silicon oxide film 18, an opening 19 that exposes at least a part of the silicon nitride film 13 and at least a part of the conductive film 16.

Figure 9A:
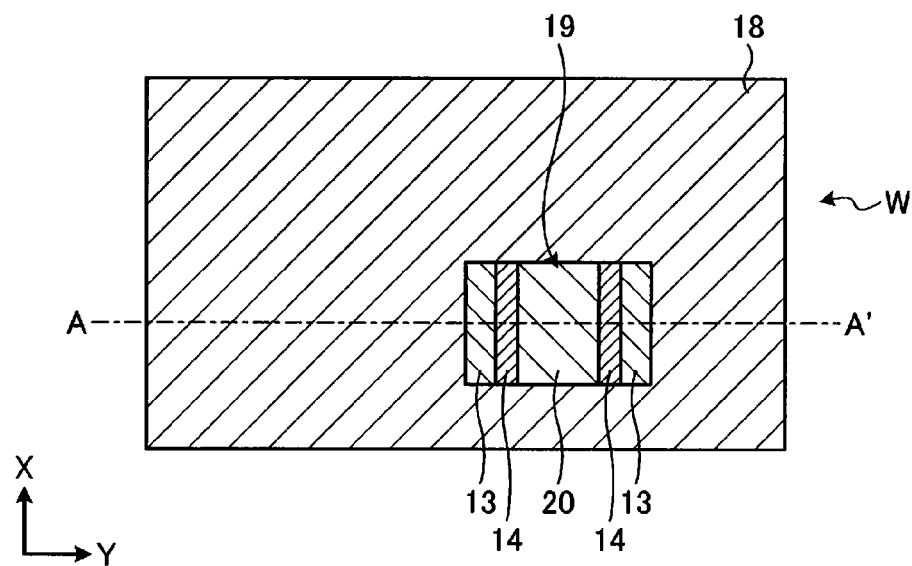
FIG. 9A is a view illustrating an example of the method of manufacturing a semiconductor device according to the first embodiment.
Figure 9B:
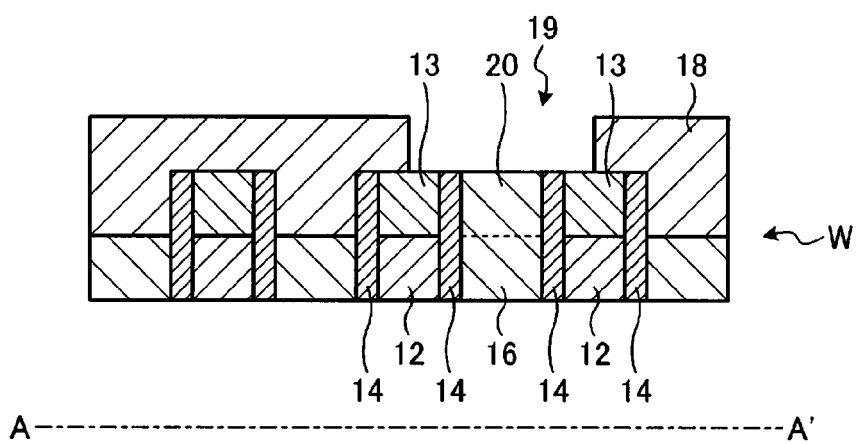
FIG. 9B is a cross-sectional view taken along line A-A' of the wafer illustrated in FIG. 9A.

Next, a conductive film 20 is formed on and in contact with the conductive film 16 in the opening 19 (step S17). The conductive film 20 may be the same metal material as the conductive film 16, or may be a different metal material. In the present embodiment, the conductive film 20 is formed of, for example, ruthenium, similar to the conductive film 16. For example, the conductive film 16 is formed on the entire surface by CVD using $Ru(DMBD)(CO)_3$ and an oxygen gas. Then, the conductive film 20 is polished by CMP or the like until the upper surface of the silicon oxide film 18 is exposed. Then, the upper portion of the conductive film 20 is etched through dry etching or the like using an oxygen gas, for example. Thereby, the wafer W enters a state illustrated in FIGS. 9A and 9B, for example. FIG. 9A is a view illustrating an example of the method of manufacturing a semiconductor device according to the first embodiment. FIG. 9A is a top view of the wafer W on which the conductive film 20 is formed. FIG. 9B is a cross-sectional view taken along line A-A' of the wafer W illustrated in FIG. 9A. The conductive film 20 corresponds to a second conductive film of the present disclosure. The portion where the conductive film 16 and the conductive film 20 are laminated functions as a contact with the active region.

Figure 10A:
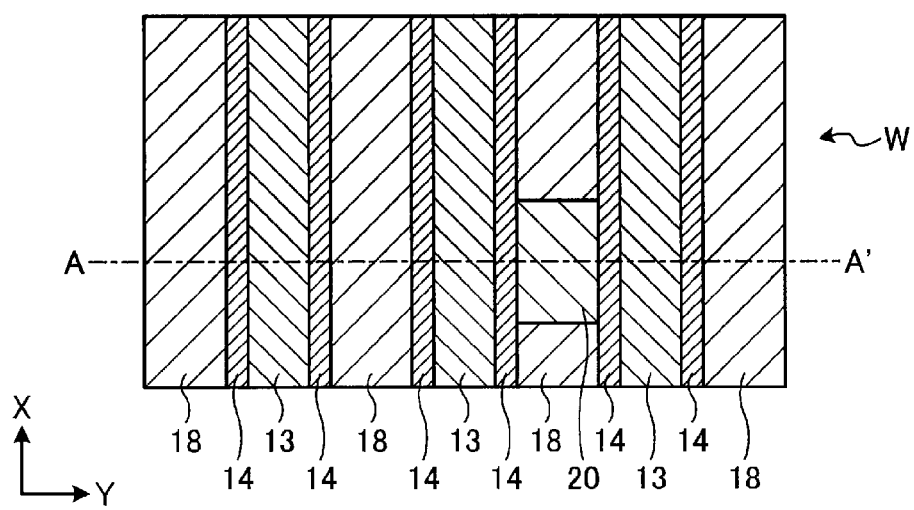
FIG. 10A is a view illustrating an example of the method of manufacturing a semiconductor device according to the first embodiment.
Figure 10B:
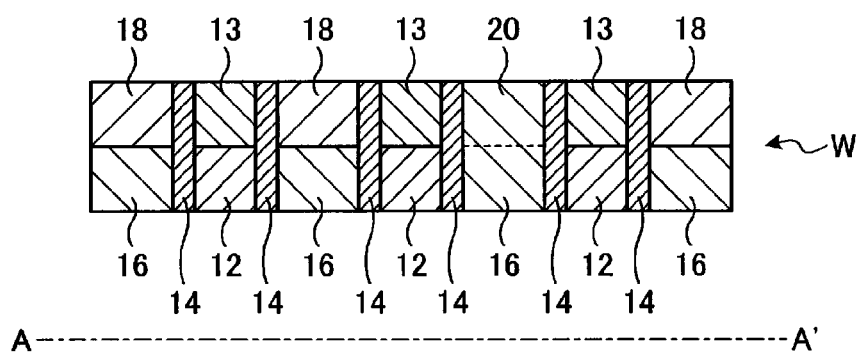
FIG. 10B is a cross-sectional view taken along line A-A' of the wafer illustrated in FIG. 10A.

Next, the silicon oxide film 18 is polished such that the upper surface of the silicon nitride film 13 is exposed (step S18). For example, the silicon oxide film 18 is polished by CMP or the like until the upper surface of the silicon nitride film 13 is exposed. Thereby, for example, as illustrated in FIGS. 10A and 10B, the wafer W is in a state where the upper surface of the conductive film 20 and the upper surface of the silicon nitride film 13 are exposed. FIG. 10A is a view illustrating an example of the method of manufacturing a semiconductor device according to the first embodiment. FIG. 10A is a top view of the wafer W on which the silicon oxide film 18 is polished. FIG. 10B is a cross-sectional view taken along line A-A' of the wafer W illustrated in FIG. 10A.

Figure 11A:
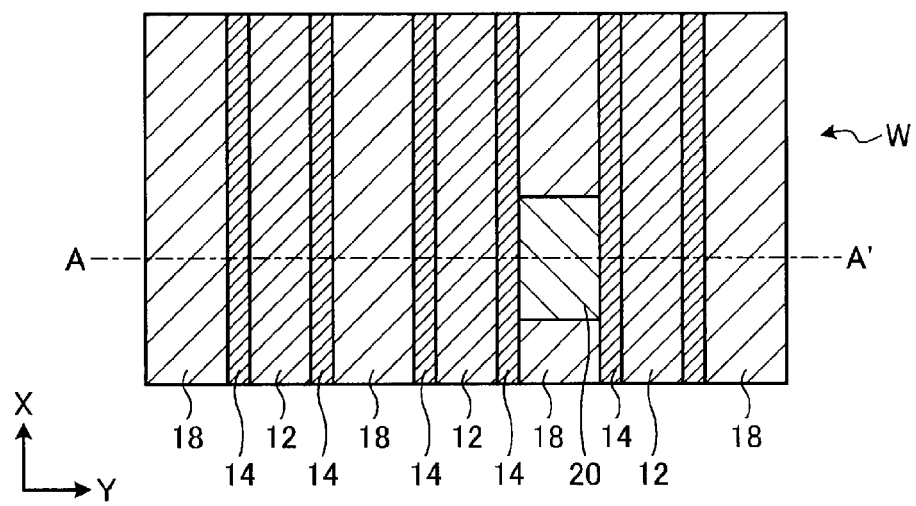
FIG. 11A is a view illustrating an example of the method of manufacturing a semiconductor device according to the first embodiment.
Figure 11B:
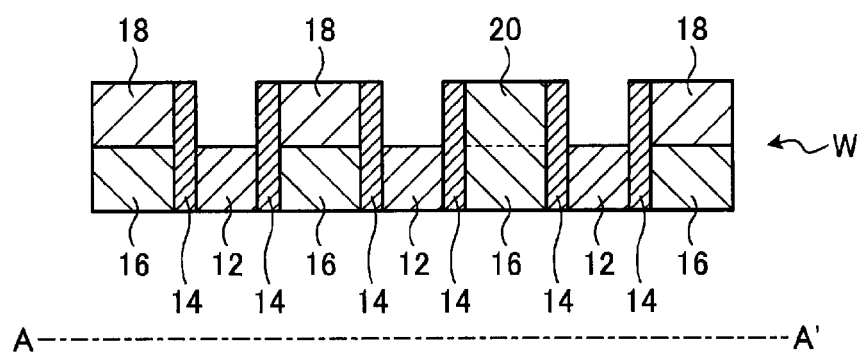
FIG. 11B is a cross-sectional view taken along line A-A' of the wafer illustrated in FIG. 11A.

Next, the exposed silicon nitride film 13 is removed (step S19). For example, the silicon nitride film 13 is etched through dry etching or the like using a mixed gas including a gas that includes fluorine and a gas that includes oxygen. Thereby, the wafer W enters a state illustrated in FIGS. 11A and 11B, for example. FIG. 11A is a view illustrating an example of the method of manufacturing the semiconductor device according to a first embodiment. FIG. 11A is a top view of the wafer W from which the exposed silicon nitride film 13 is removed. FIG. 11B is a cross-sectional view taken along line A-A' of the wafer W illustrated in FIG. 11A. Removal of the silicon nitride film 13 exposes the conductive film 12 formed on the lower layer of the silicon nitride film 13.

Figure 12A:
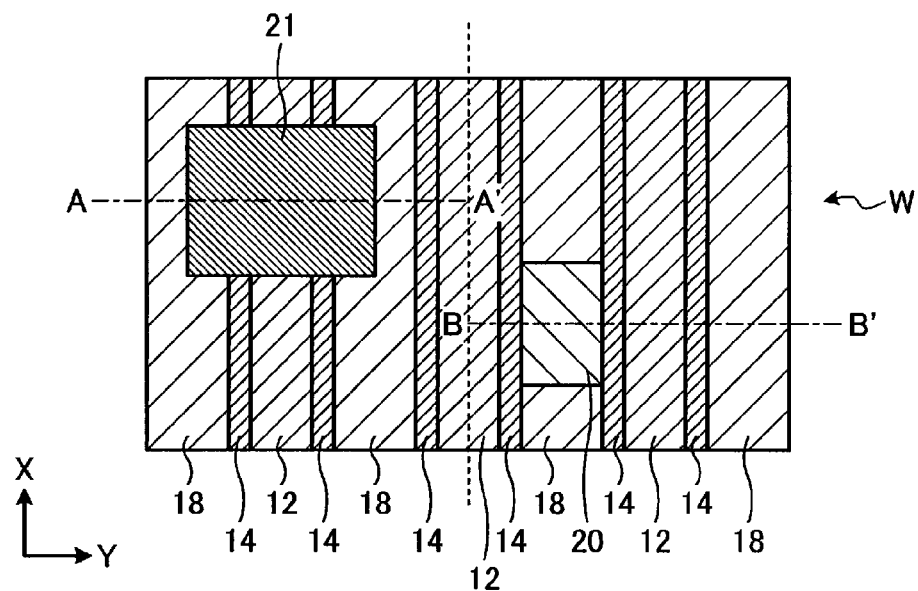
FIG. 12A is a view illustrating an example of the method of manufacturing a semiconductor device according to the first embodiment.
Figure 12B:
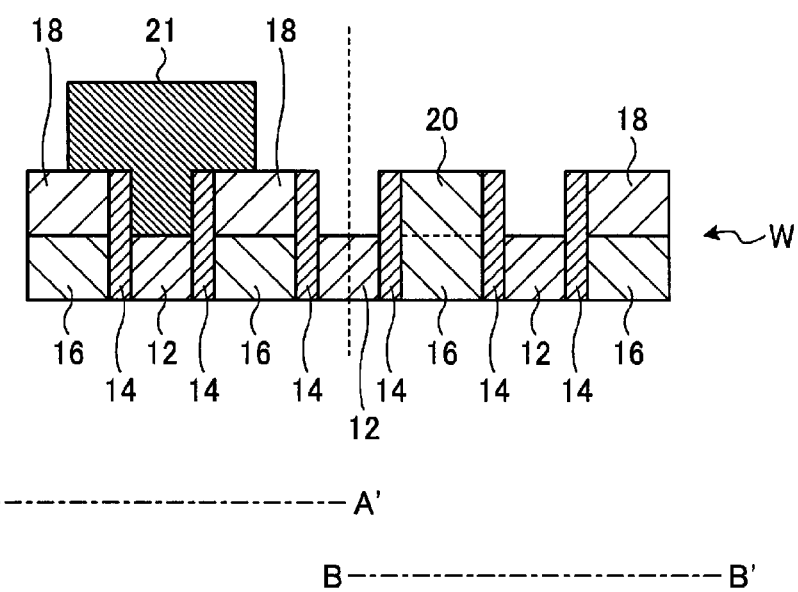
FIG. 12B is a cross-sectional view taken along lines A-A' and B-B' of the wafer illustrated in FIG. 12A.

Next, a carbon-containing film 21 is formed on the silicon oxide film 18 and the conductive film 12 (step S20). For example, the film 21 is formed at a position where a contact is formed between the silicon oxide film 18 and a gate electrode on the conductive film 12. For example, a film is formed on the entire surfaces of the silicon oxide film 18 and the conductive film 12 by a carbon-containing hard mask or resist. Then, a mask film is formed on the formed film, and a pattern is formed in the mask film by photolithography such that the mask film remains in the region where the contact with the conductive film 12 is to be formed. Then, patterning is performed using the mask film as a mask, and the film 21 is formed at a position where a contact is to be formed. Thereby, the wafer W enters a state illustrated in FIGS. 12A and 12B, for example. FIG. 12A is a view illustrating an example of the method of manufacturing a semiconductor device according to the first embodiment. FIG. 12A is a top view of the wafer W on which the carbon-containing film 21 is formed. FIG. 12B is a cross-sectional view taken along lines A-A' and B-B' of the wafer W illustrated in FIG. 12A.

Figure 13A:
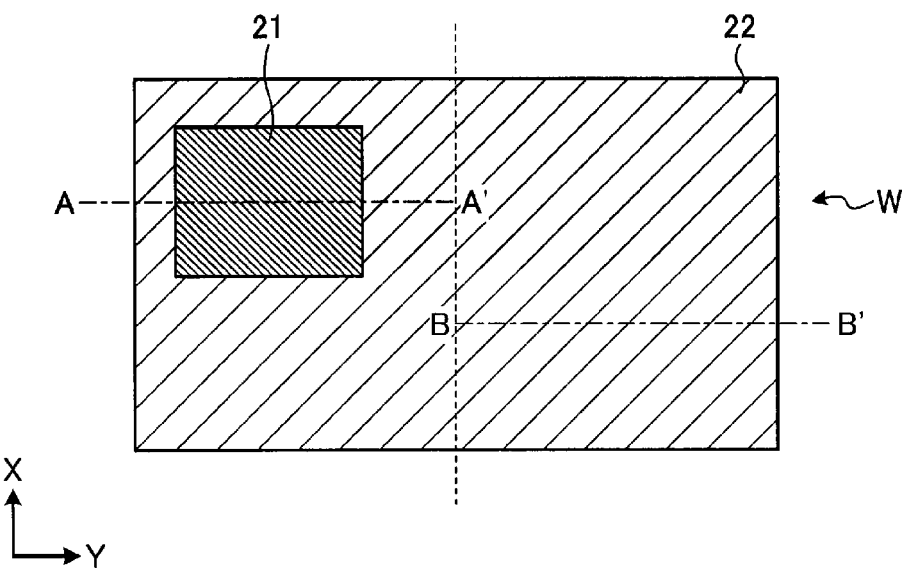
FIG. 13A is a view illustrating an example of the method of manufacturing a semiconductor device according to the first embodiment.
Figure 13B:
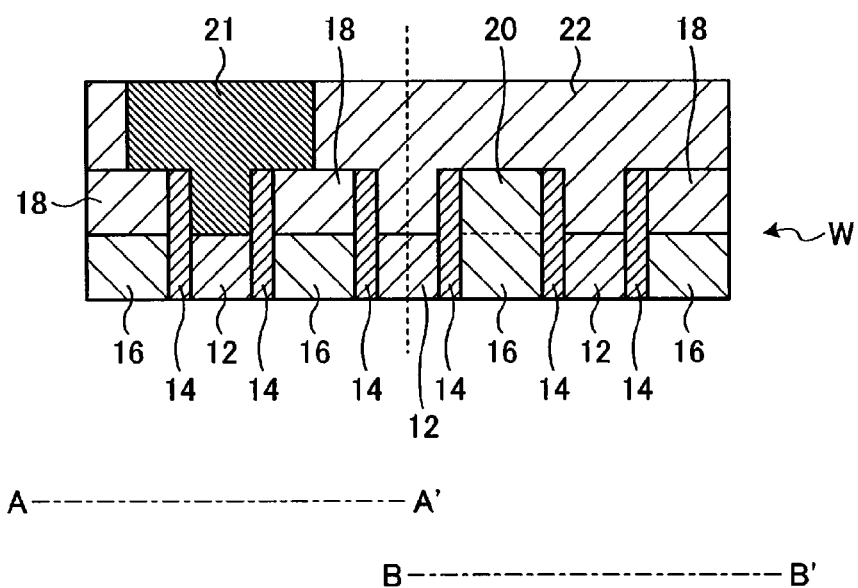
FIG. 13B is a cross-sectional view taken along lines A-A' and B-B' of the wafer illustrated in FIG. 13A.

Next, a silicon oxide film 22 that surrounds the film 21 is formed on the silicon oxide film 18 (step S21). For example, the silicon oxide film 22 is formed on the entire surfaces of the silicon oxide film 18, the conductive film 20, and the film 21 by CVD or coating. Then, the silicon oxide film 22 is polished by CMP or the like until the upper surface of the film 21 is exposed. Thereby, the wafer W enters a state illustrated in FIGS. 13A and 13B, for example. FIG. 13A is a view illustrating an example of the method of manufacturing a semiconductor device according to the first embodiment. FIG. 13A is a top view of the wafer W on which the silicon oxide film 22 surrounding the carbon-containing film 21 is formed. FIG. 13B is a cross-sectional view taken along lines A-A' and B-B' of the wafer W illustrated in FIG. 13A.

Figure 14A:
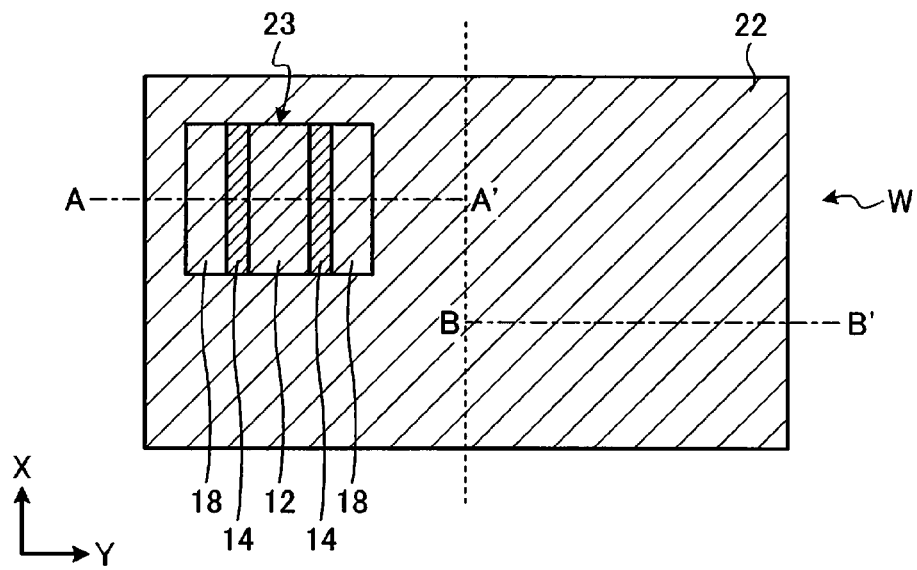
FIG. 14A is a view illustrating an example of the method of manufacturing a semiconductor device according to the first embodiment.
Figure 14B:
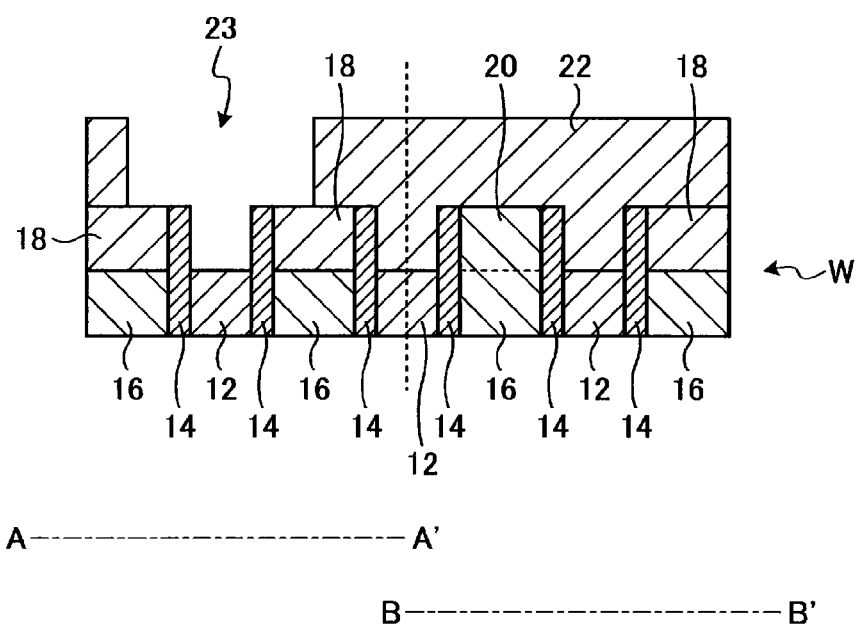
FIG. 14B is a cross-sectional view taken along lines A-A' and B-B' of the wafer illustrated in FIG. 14A.

Next, the carbon-containing film 21 is removed (step S22). For example, the carbon-containing film 21 is etched through dry etching or the like using an oxygen gas. Since the etching selectivity between the carbon-containing film 21 and the silicon oxide film 22 is sufficiently large, the removal of the film 21 may be performed by anisotropic etching or may be performed by isotropic etching. Thereby, the wafer W enters a state illustrated in FIGS. 14A and 14B, for example. FIG. 14A is a view illustrating an example of the method of manufacturing a semiconductor device according to the first embodiment. FIG. 14A is a top view of the wafer W from which the carbon-containing film 21 is removed. FIG. 14B is a cross-sectional view taken along lines A-A' and B-B' of the wafer W illustrated in FIG. 14A. Removal of the film 21 forms, in the silicon oxide film 22, an opening 23 that exposes at least a part of the conductive film 12 and at least a part of the silicon oxide film 18.

Figure 15A:
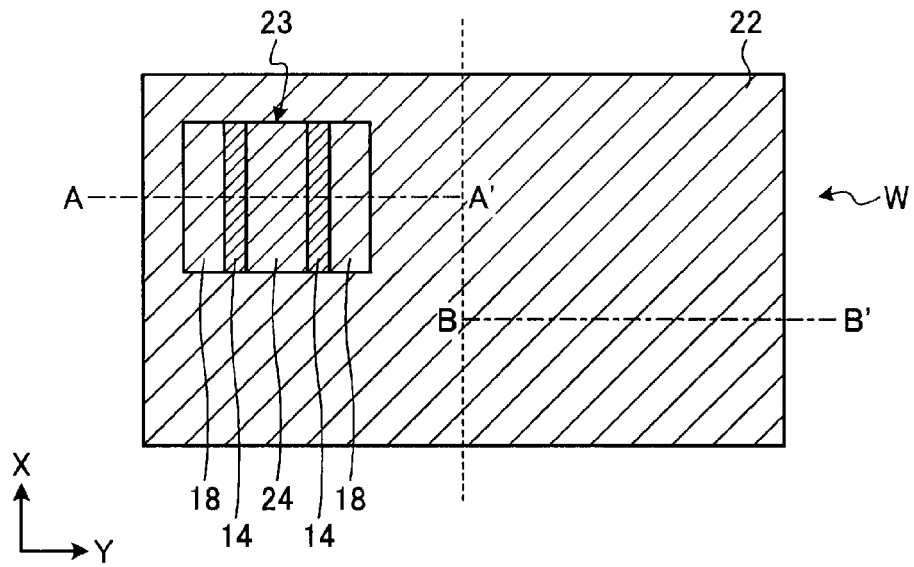
FIG. 15A is a view illustrating an example of the method of manufacturing a semiconductor device according to the first embodiment.
Figure 15B:
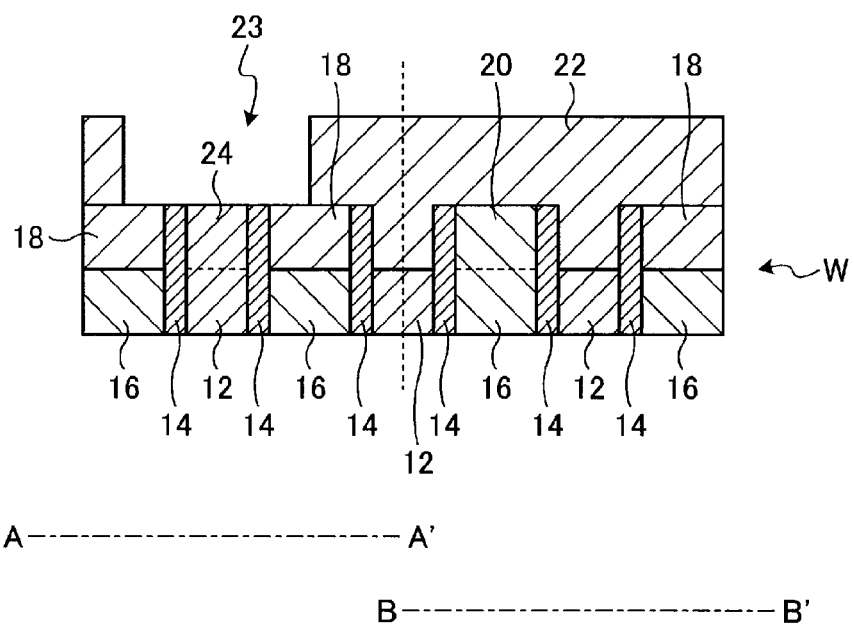
FIG. 15B is a cross-sectional view taken along lines A-A' and B-B' of the wafer illustrated in FIG. 15A.

Next, a conductive film 24 is formed on and in contact with the conductive film 12 in the opening 23 (step S23). For example, the conductive film 24 is formed on the entire surface by CVD using $Ru(DMBD)(CO)_3$ and an oxygen gas. Then, the conductive film 24 is polished by CMP or the like until the upper surface of the silicon oxide film 22 is exposed. Then, the upper portion of the conductive film 24 is etched through dry etching or the like using an oxygen gas, for example. Thereby, the wafer W enters a state illustrated in FIGS. 15A and 15B, for example. FIG. 15A is a view illustrating an example of the method of manufacturing a semiconductor device according to the first embodiment. FIG. 15A is a top view of the wafer W on which the conductive film 24 is formed. FIG. 15B is a cross-sectional view taken along lines A-A' and B-B' of the wafer W illustrated in FIG. 15A.

Figure 16A:
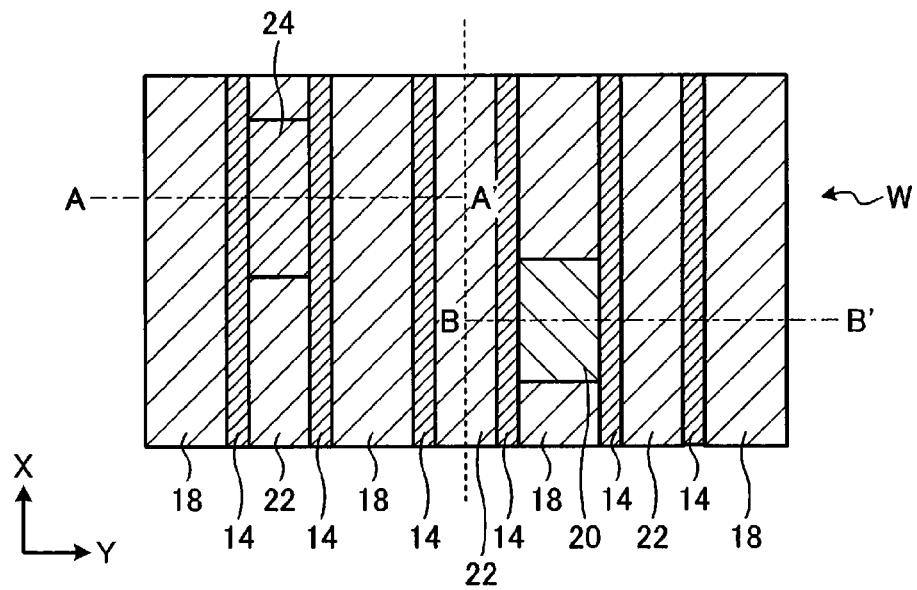
FIG. 16A is a view illustrating an example of the method of manufacturing a semiconductor device according to the first embodiment.
Figure 16B:
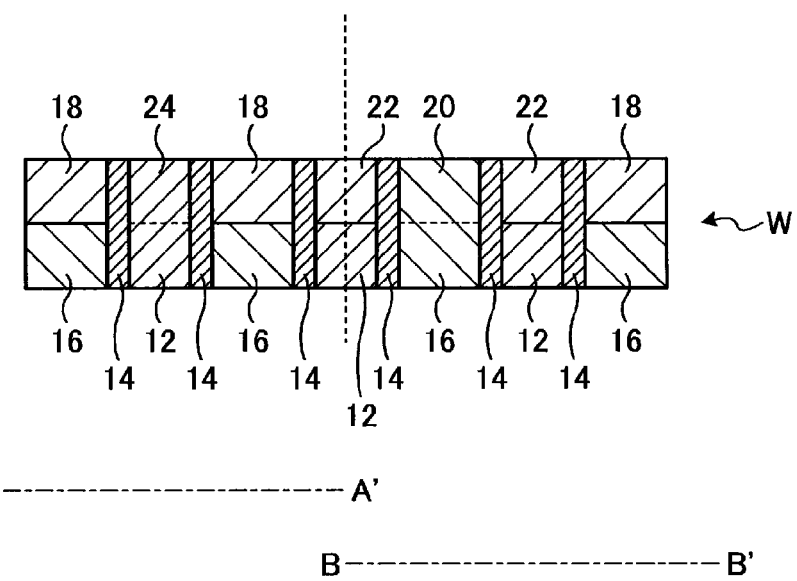
FIG. 16B is a cross-sectional view taken along lines A-A' and B-B' of the wafer illustrated in FIG. 16A.

Next, the silicon oxide film 22 is polished such that the upper surfaces of the conductive films 20 and 24 are exposed (step S24). For example, the silicon oxide film 22 is polished by CMP or the like until the upper surfaces of the conductive films 20 and 24 are exposed. Thereby, the wafer W enters a state illustrated in FIGS. 16A and 16B, for example. FIG. 16A is a view illustrating an example of the method of manufacturing a semiconductor device according to the first embodiment. FIG. 16A is a top view of the wafer W in which the silicon oxide film 22 is polished. FIG. 16B is a cross-sectional view taken along lines A-A' and B-B' of the wafer W illustrated in FIG. 16A. The portion where the conductive film 12 and the conductive film 24 are laminated functions as a contact with the gate electrode. Further, the portion where the conductive film 16 and the conductive film 20 are laminated functions as a contact with the active region. Wiring or the like for connecting the conductive film 20 and the conductive film 24 is further formed on the upper portion of the wafer W as necessary.

In this way, in the method of manufacturing a semiconductor device according to the first embodiment, the opening 19 can be formed, without performing selective etching of the silicon nitride film 13, by removing the film 17. Further, in the method of manufacturing a semiconductor device according to the first embodiment, the opening 23 can be formed by removing the film 21. Thereby, in the method of manufacturing a semiconductor device according to the embodiment, it is possible to suppress the occurrence of a short circuit when the opening 19 connected to the gate electrode or the opening 23 connected to the active region is formed. Further, in the method of manufacturing a semiconductor device according to the first embodiment, since the contact to the gate electrode can be disposed on the active region, the area of the cell can be reduced. Further, in the method of manufacturing a semiconductor device according to the first embodiment, a via connected to a gate electrode or a via connected to a trench contact can be formed by etching having a sufficiently large selectivity.

In this way, in the method of manufacturing a semiconductor device according to the first embodiment, the carbon-containing film 17 is formed on the silicon nitride film 13 and the conductive film 16. In the method of manufacturing a semiconductor device, the silicon oxide film 18 is formed on the silicon nitride film 13 and the conductive film 16, and surrounds the film 17. In the method of manufacturing a semiconductor device, the film 17 is removed to form, in the silicon oxide film 18, the opening 19 that exposes at least a part of the silicon nitride film 13 and at least a part of the conductive film 16. Then, in the method of manufacturing a semiconductor device, the conductive film 20 is formed on and in contact with the conductive film 16 in the opening 19. In this way, in the method of manufacturing a semiconductor device according to the first embodiment, since the opening 19 for forming a contact can be formed by removing the carbon-containing film 17, the occurrence of a short circuit can be suppressed.

In the method of manufacturing a semiconductor device according to the first embodiment, the silicon oxide film 18 is polished such that the upper surfaces of the conductive film 20 and the silicon nitride film 13 are exposed. In the method of manufacturing a semiconductor device, the exposed silicon nitride film 13 is removed to expose the conductive film 12 formed on the lower layer of the silicon nitride film 13. In the method of manufacturing a semiconductor device, the carbon-containing film 21 is formed on the silicon oxide film 18 and the conductive film 12. In the method of manufacturing a semiconductor device, the silicon oxide film 22 is formed on the silicon oxide film 18 and surrounds the film 21. In the method of manufacturing a semiconductor device, the film 21 is removed to form, in the silicon oxide film 22, the opening 23 that exposes at least a part of the conductive film 12 and at least a part of the silicon oxide film 18. In the method of manufacturing a semiconductor device, the conductive film 24 is formed on and in contact with the conductive film 12 in the opening 23. In this way, in the method of manufacturing a semiconductor device according to the first embodiment, since the opening 23 for forming a contact can be formed by removing the carbon-containing film 21, the occurrence of a short circuit can be suppressed.

Further, the conductive film 16 and the conductive film 20 serve as a contact with the active region of the FET formed in the semiconductor device. Thereby, in the method of manufacturing a semiconductor device, it is possible to suppress the occurrence of a short circuit with respect to the active region of the FET.

Further, the conductive film 12 and the conductive film 24 serve as a contact with the gate of the FET. Thereby, in the method of manufacturing a semiconductor device, it is possible to suppress the occurrence of a short circuit with respect to the gate of the FET.

Further, the insulating spacer 14 is provided between the conductive film 16, and the silicon nitride film 13 and the conductive film 12. Thereby, in the method of manufacturing a semiconductor device, the conductive film 12 and the conductive film 16 can be insulated from each other by the spacer 14.

Further, the conductive film 16 is formed such that the upper surface thereof is lower than the upper surface of the silicon nitride film 13. Thereby, in the method of manufacturing a semiconductor device, it is possible to suppress the conductive film 16 from being short-circuited with another conductive film 16 in the upper portion.

Second Embodiment

Next, a method of manufacturing a semiconductor device according to a second embodiment will be described. In the second embodiment, a case will be described in which the formation of the silicon nitride film 13 for capping the conductive film 12 is omitted.

Figure 17:
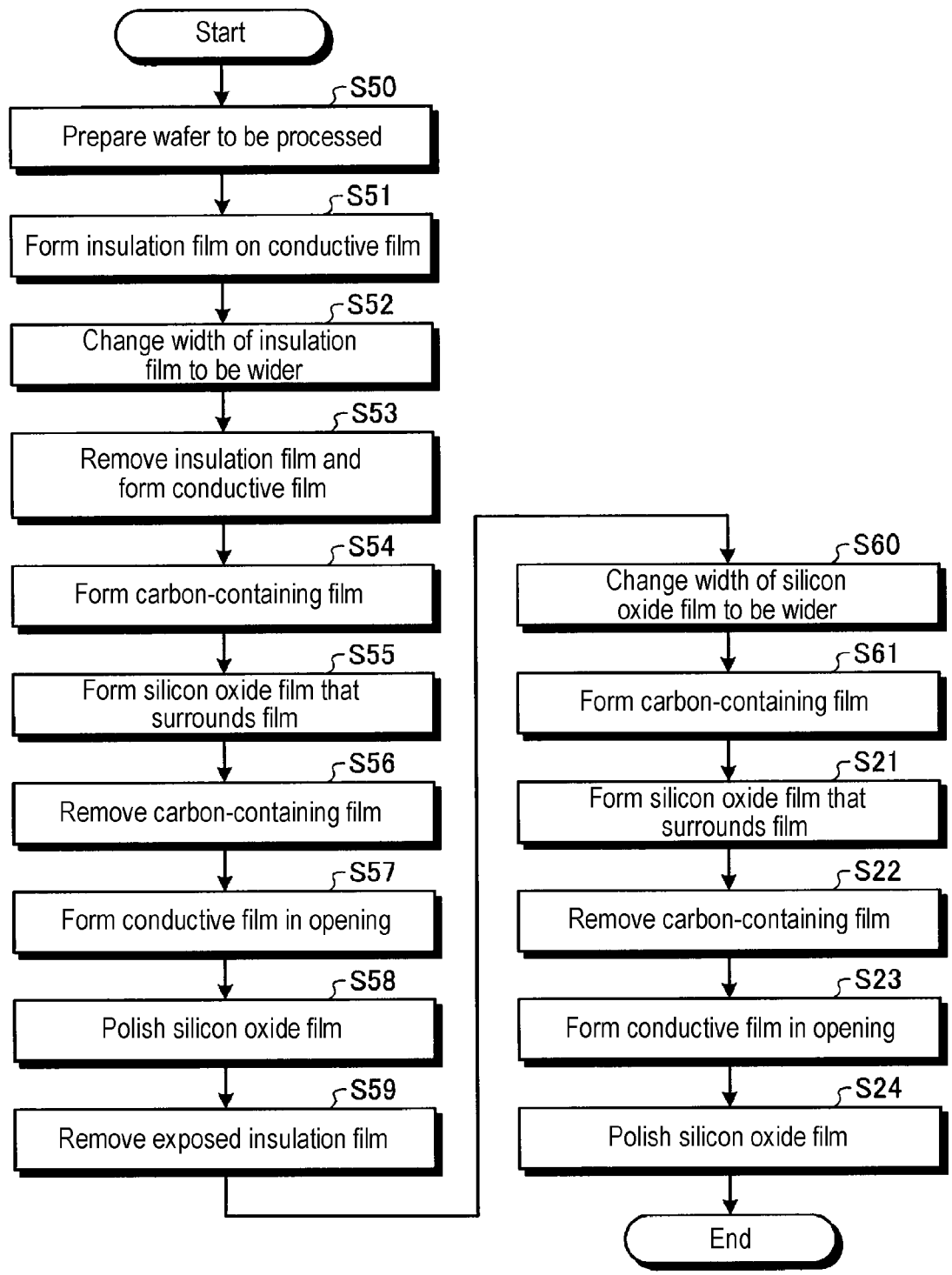
FIG. 17 is a flowchart illustrating an example of a method of manufacturing a semiconductor device according to a second embodiment.

FIG. 17 is a flowchart illustrating an example of the method of manufacturing a semiconductor device according to the second embodiment. Since the processing of the method of manufacturing a semiconductor device according to the second embodiment is partially the same as that of the method of manufacturing a semiconductor device according to the first embodiment shown in FIG. 1, the same processing will be denoted by the same reference numerals and descriptions thereof will be omitted, and mainly, different processing portions will be described. FIG. 17 illustrates a procedure of forming contacts with the active region and the gate electrode of the FET, respectively. In the present embodiment, a semiconductor device is manufactured on a wafer W by the procedure shown in the flowchart of FIG. 17. Hereinafter, an example of a method of manufacturing a semiconductor device will be described with reference to FIGS. 18A to 30B. Note that, since the configuration of the wafer W formed by the method of manufacturing a semiconductor device according to the second embodiment is partially the same as the configuration of the first embodiment, the same components will be denoted by the same reference numerals.

Figure 18A:
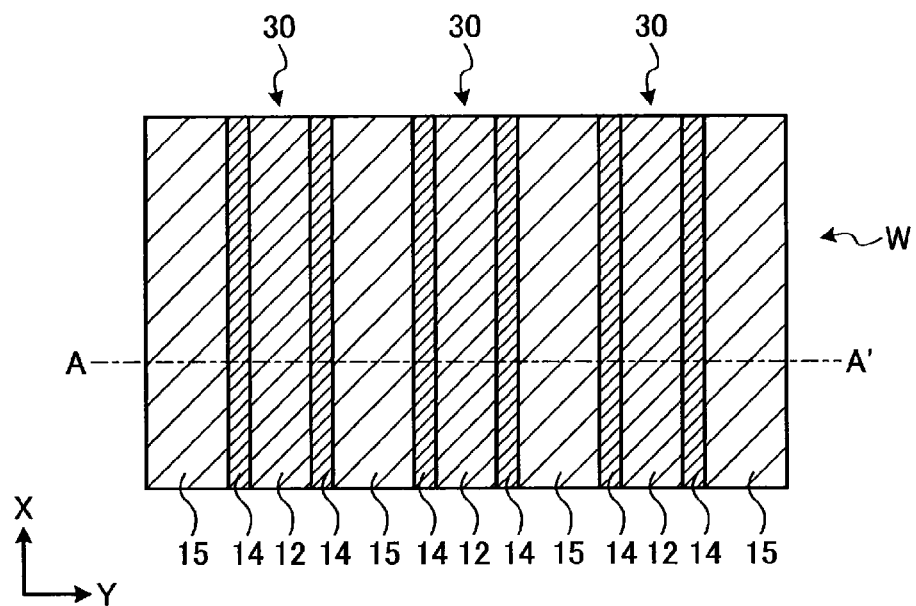
FIG. 18A is a view illustrating an example of the method of manufacturing a semiconductor device according to the second embodiment.
Figure 18B:
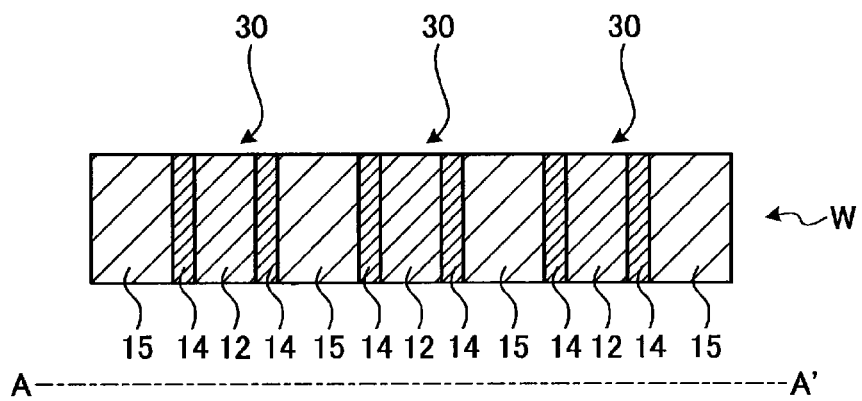
FIG. 18B is a cross-sectional view taken along line A-A' of the wafer illustrated in FIG. 18A.

First, a wafer W to be processed is prepared (step S50). The wafer W to be processed has, for example, a structure as illustrated in FIGS. 18A and 18B. FIG. 18A is a view illustrating an example of the method of manufacturing a semiconductor device according to the second embodiment. FIG. 18A is a top view illustrating an example of the wafer W on which the semiconductor device according to the second embodiment is manufactured. FIG. 18B is a cross-sectional view taken along line A-A' of the wafer W illustrated in FIG. 18A.

The wafer W is laminated with a conductive film 12 of tungsten or the like. As illustrated in FIG. 2C, the conductive film 12 may have a configuration in which the periphery (the bottom surface and the side surface) is covered with a laminated structure of films 12a and 12b. The side surface of the conductive film 12 is covered with an insulating spacer 14. The spacer 14 is formed of, for example, an insulating material such as SiOCN. For example, as illustrated in FIGS. 18A and 18B, the structures 30 each having the conductive film 12 covered with the spacers 14 are disposed at a predetermined interval in the y-axis direction, and each of the structures 30 extends in the x-axis direction. Further, an insulation film 15 is embedded between the structures 30 adjacent to each other in the y-axis direction. The insulation film 15 is formed of, for example, a silicon oxide such as a $SiO_2$. In the wafer W, an active region that is a semiconductor such as silicon into which, for example, a p-type impurity is introduced, and an insulating region made of, for example, a silicon oxide, are formed on the lower layer of the conductive film 12, the spacer 14, and the insulation film 15.

Figure 19A:
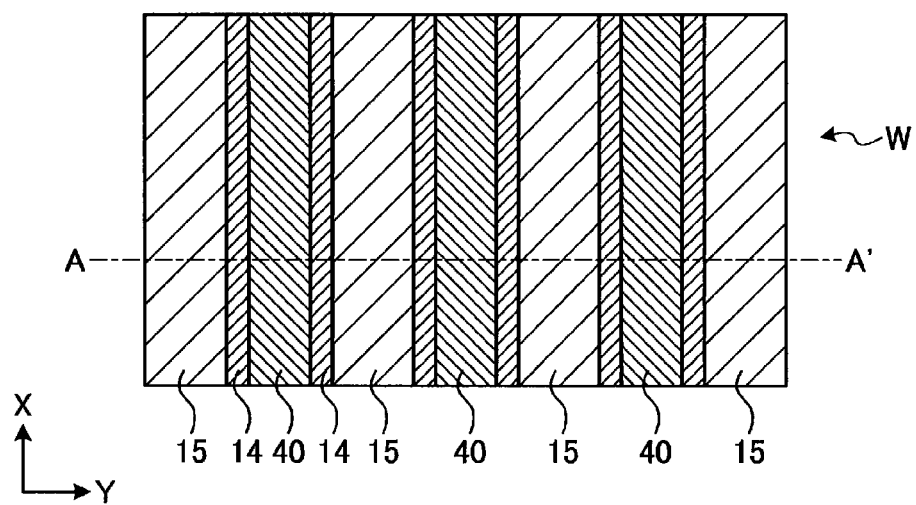
FIG. 19A is a view illustrating an example of the method of manufacturing a semiconductor device according to the second embodiment.
Figure 19B:
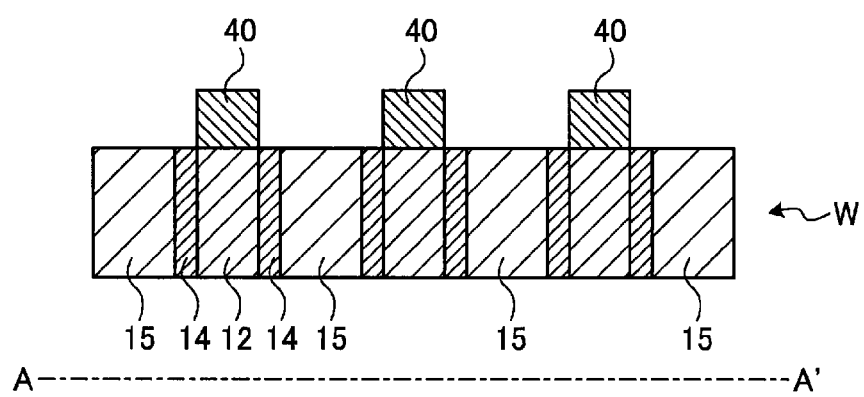
FIG. 19B is a cross-sectional view taken along line A-A' of the wafer illustrated in FIG. 19A.

Next, an insulation film 40 is formed on the conductive film 12 by selective growth (step S51). The insulation film 40 may be a nitride film such as a silicon nitride film, or may be a metal oxide such as titanium oxide. In the present embodiment, the insulation film 40 is, for example, a nitride film. For example, the insulation film 40 is formed as a nitride film on the conductive film 12, which is a metal material, by selective growth using a mixed gas including a gas that includes nitrogen and a gas that includes silicon. Thereby, the wafer W enters a state illustrated in FIGS. 19A and 19B, for example. FIG. 19A is a view illustrating an example of the method of manufacturing a semiconductor device according to the second embodiment. FIG. 19A is a top view of the wafer W in which the insulation film 40 is formed on the conductive film 12. FIG. 19B is a cross-sectional view taken along line A-A' of the wafer W illustrated in FIG. 19A.

Figure 20A:
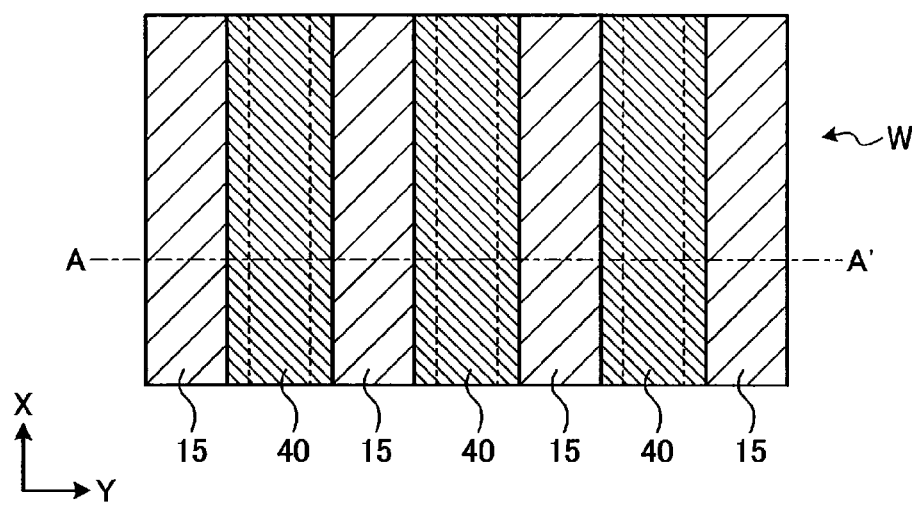
FIG. 20A is a view illustrating an example of the method of manufacturing a semiconductor device according to the second embodiment.
Figure 20B:
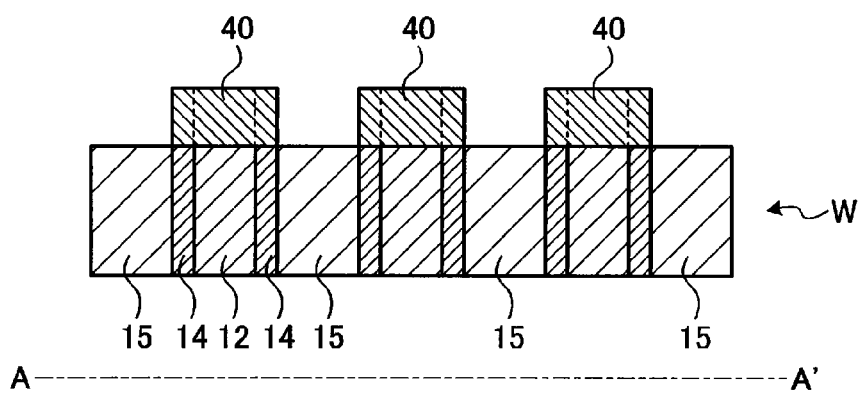
FIG. 20B is a cross-sectional view taken along line A-A' of the wafer illustrated in FIG. 20A.

Next, a width of the insulation film 40 is changed to be wider to cover the upper surface of the spacer 14 (step S52). For example, an insulation film of the same type as the insulation film 40 is formed on the entire surfaces of the insulation film 15 and the insulation film 40 by CVD or coating, and the width of the insulation film 40 is changed to be wider by etching back the formed insulation film. Thereby, the wafer W enters a state illustrated in FIGS. 20A and 20B, for example. FIG. 20A is a view illustrating an example of the method of manufacturing a semiconductor device according to the second embodiment. FIG. 20A is a top view of the wafer W in which the width of the insulation film 40 is changed to be wider. FIG. 20B is a cross-sectional view taken along line A-A' of the wafer W illustrated in FIG. 20A. The insulation film 40 has a large width to cover the upper surface of the spacer 14.

Figure 21A:
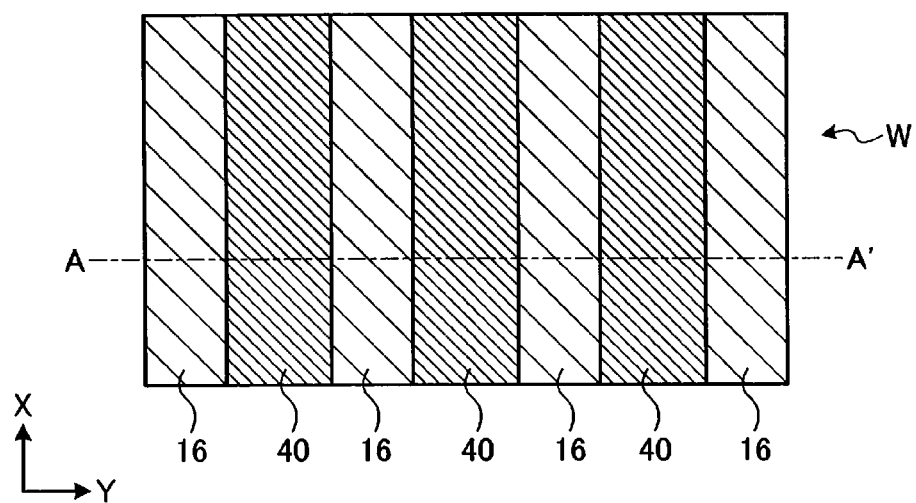
FIG. 21A is a view illustrating an example of the method of manufacturing a semiconductor device according to the second embodiment.
Figure 21B:
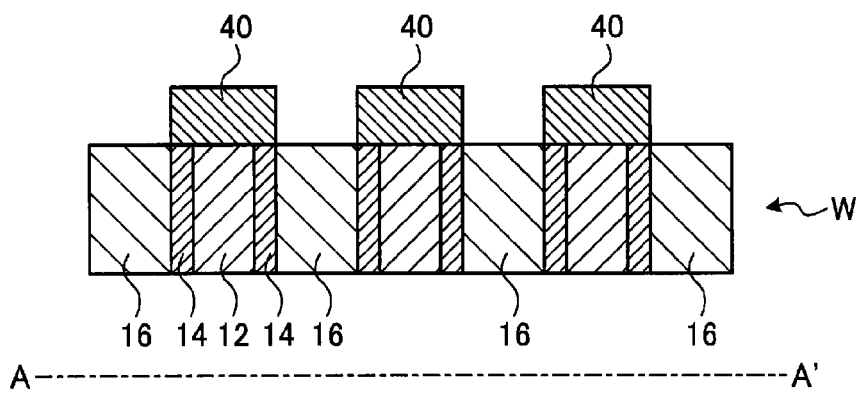
FIG. 21B is a cross-sectional view taken along line A-A' of the wafer illustrated in FIG. 21A.

Next, the insulation film 15 is removed, and a conductive film 16 is formed (step S53). The conductive film 16 is formed of, for example, a conductive metal material such as ruthenium (Ru) cobalt or tungsten. In the present embodiment, the conductive film 16 is formed of, for example, ruthenium. For example, the same processing as in steps S11 to S13 of the first embodiment is performed, and for example, the conductive film 16 is formed by removing the insulation film 15 by dry etching or the like using a fluorocarbon gas, and the upper surface of the insulation film 40 is exposed by polishing the conductive film 16. Further, the conductive film 16 is recessed such that the upper surface of the conductive film 16 is lower than the upper surface of the insulation film 40. Thereby, the wafer W enters a state illustrated in FIGS. 21A and 21B, for example. FIG. 21A is a view illustrating an example of the method of manufacturing a semiconductor device according to the second embodiment. FIG. 21A is a top view of the wafer W on which the conductive film 16 is formed. FIG. 21B is a cross-sectional view taken along line A-A' of the wafer W illustrated in FIG. 21A.

Figure 22A:
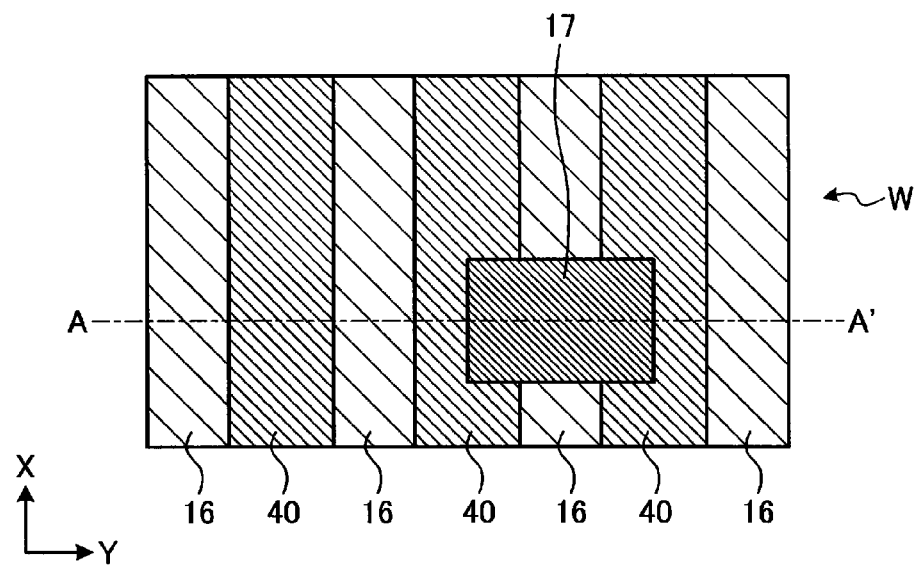
FIG. 22A is a view illustrating an example of the method of manufacturing a semiconductor device according to the second embodiment.
Figure 22B:
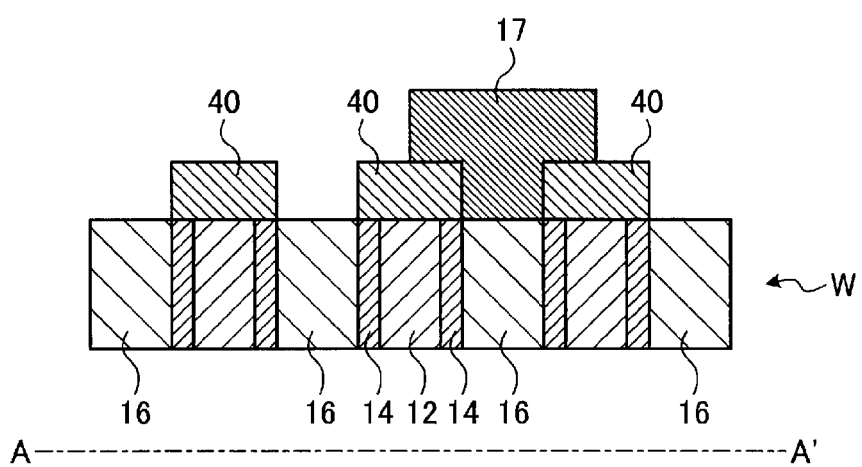
FIG. 22B is a cross-sectional view taken along line A-A' of the wafer illustrated in FIG. 22A.

Next, a carbon-containing film 17 is formed on the insulation film 40 and the conductive film 16 (step S54). For example, the film 17 is formed at a position where a contact is formed between the insulation film 40 and the active region on the conductive film 16. For example, a film is formed on the entire surfaces of the insulation film 40 and the conductive film 16 by a carbon-containing hard mask or resist. Then, a mask film is formed on the formed film, and a pattern is formed in the mask film by photolithography such that the mask film remains in the region where the contact with the conductive film 16 is to be formed. Then, patterning is performed using the mask film as a mask, and the film 17 is formed at a position where a contact is to be formed. Thereby, the wafer W enters a state illustrated in FIGS. 22A and 22B, for example. FIG. 22A is a view illustrating an example of the method of manufacturing a semiconductor device according to the second embodiment. FIG. 22A is a top view of the wafer W on which the carbon-containing film 17 is formed. FIG. 22B is a cross-sectional view taken along line A-A' of the wafer W illustrated in FIG. 22A.

Figure 23A:
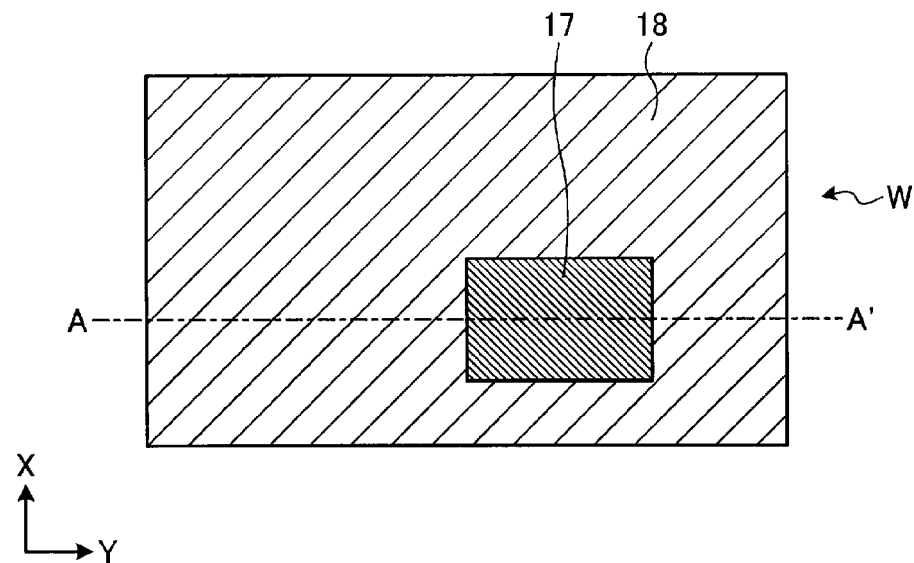
FIG. 23A is a view illustrating an example of a method of manufacturing a semiconductor device according to the second embodiment.
Figure 23B:
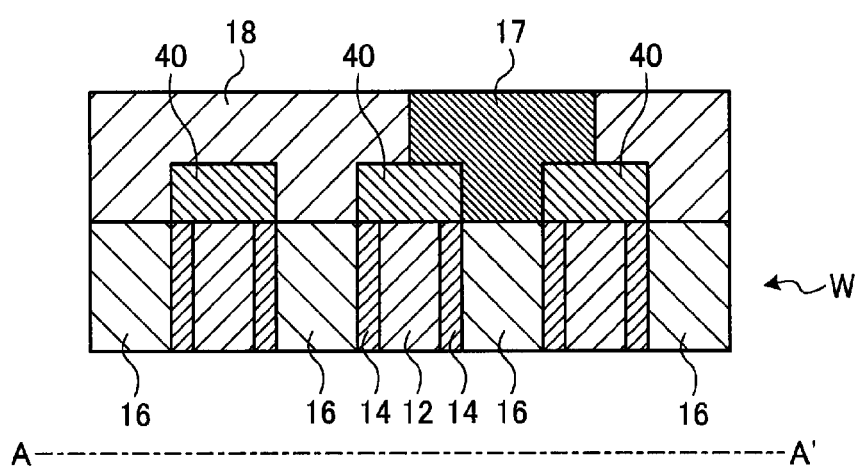
FIG. 23B is a cross-sectional view taken along line A-A' of the wafer illustrated in FIG. 23A.

Next, a silicon oxide film 18 surrounding the film 17 is formed on the insulation film 40 and the conductive film 16 (step S55). For example, the silicon oxide film 18 is formed on the entire surfaces of the film 17, the insulation film 40, and the conductive film 16 by CVD or coating. Then, the silicon oxide film 18 is polished by CMP or the like until the upper surface of the film 17 is exposed. Thereby, the wafer W enters a state illustrated in FIGS. 23A and 23B, for example. FIG. 23A is a view illustrating an example of the method of manufacturing a semiconductor device according to the second embodiment. FIG. 23A is a top view of the wafer W on which the silicon oxide film 18 surrounding the carbon-containing film 17 is formed. FIG. 23B is a cross-sectional view taken along line A-A' of the wafer W illustrated in FIG. 23A.

Figure 24A:
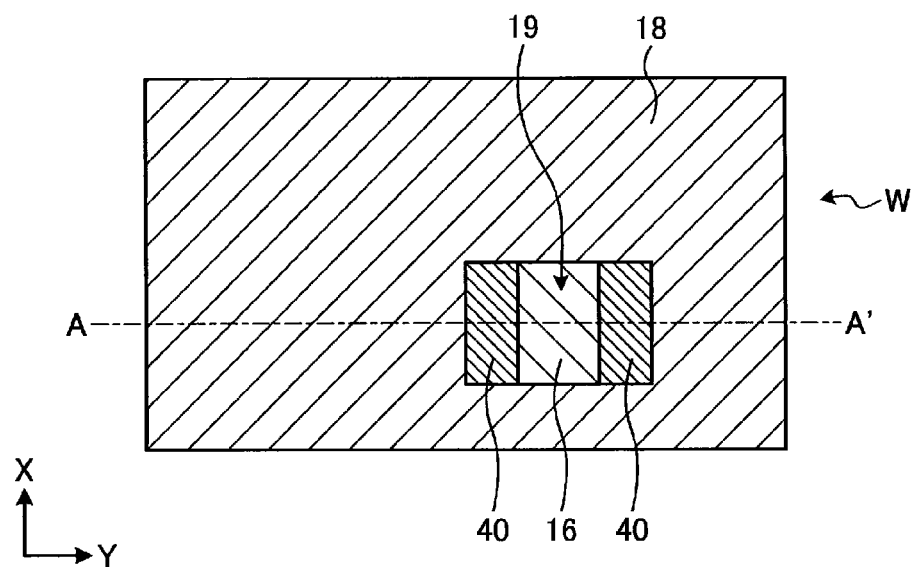
FIG. 24A is a view illustrating an example of the method of manufacturing a semiconductor device according to the second embodiment.
Figure 24B:
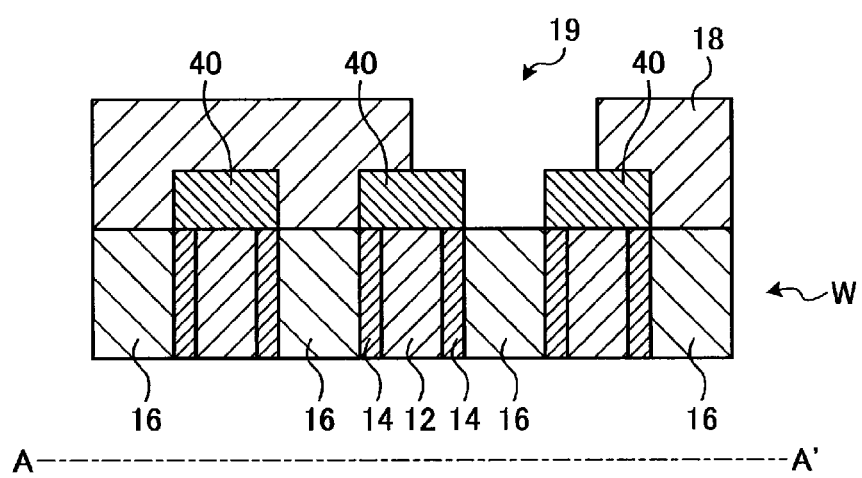
FIG. 24B is a cross-sectional view taken along line A-A' of the wafer illustrated in FIG. 24A.

Next, the carbon-containing film 17 is removed (step S56). For example, the carbon-containing film 17 is etched through dry etching or the like using an oxygen gas. Since the etching selectivity between the carbon-containing film 17 and the silicon oxide film 18 is sufficiently large, the removal of the film 17 may be performed by anisotropic etching or may be performed by isotropic etching. Thereby, the wafer W enters a state illustrated in FIGS. 24A and 24B, for example. FIG. 24A is a view illustrating an example of the method of manufacturing a semiconductor device according to the second embodiment. FIG. 24A is a top view of the wafer W from which the carbon-containing film 17 is removed. FIG. 24B is a cross-sectional view taken along line A-A' of the wafer W illustrated in FIG. 24A. Removal of the film 17 forms, in the silicon oxide film 18, an opening 19 that exposes at least a part of the insulation film 40 and at least a part of the conductive film 16.

Figure 25A:
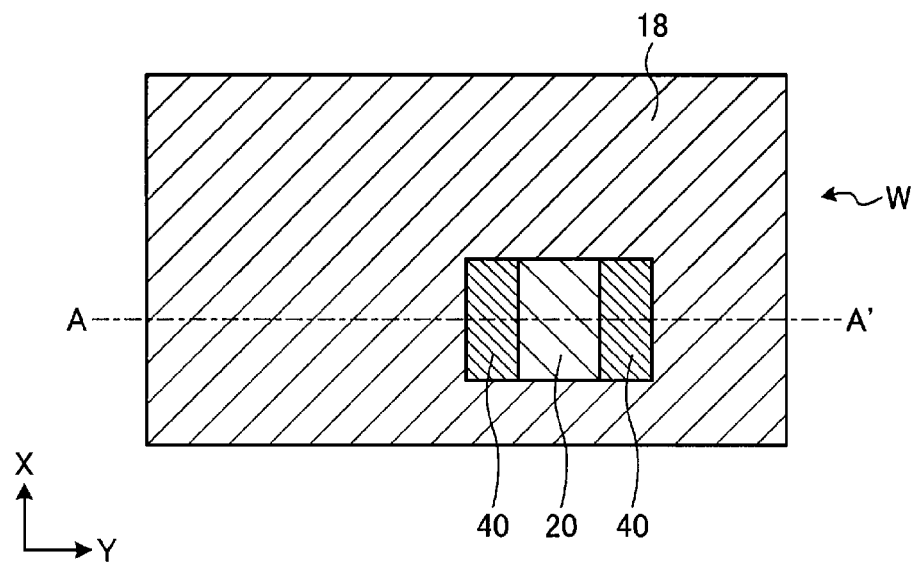
FIG. 25A is a view illustrating an example of the method of manufacturing a semiconductor device according to the second embodiment.
Figure 25B:
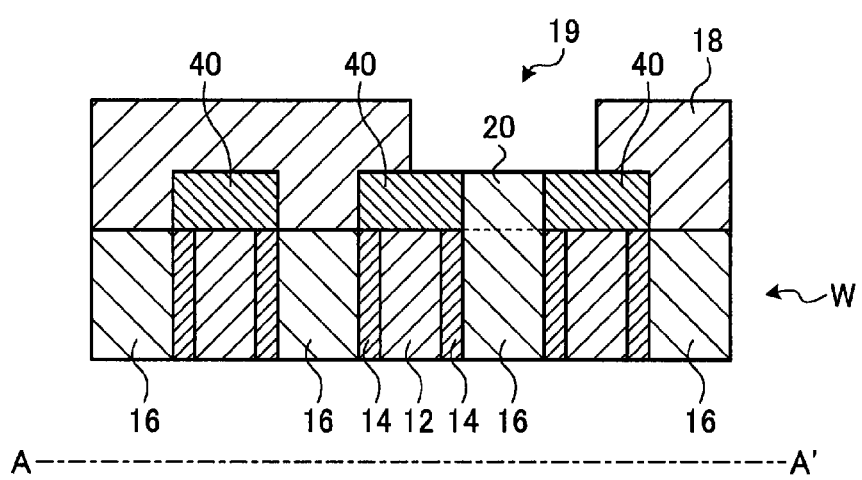
FIG. 25B is a cross-sectional view taken along line A-A' of the wafer illustrated in FIG. 25A.

Next, a conductive film 20 is formed on and in contact with the conductive film 16 in the opening 19 (step S57). The conductive film 20 may be the same metal material as the conductive film 16, or may be a different metal material. In the present embodiment, the conductive film 20 is formed of, for example, ruthenium, similar to the conductive film 16. For example, the conductive film 16 is formed on the entire surface by CVD using Ru(DMBD)(CO)$_3$ and an oxygen gas. Then, the conductive film 20 is polished by CMP or the like until the upper surface of the silicon oxide film 18 is exposed. Then, the upper portion of the conductive film 20 is etched through dry etching or the like using an oxygen gas, for example. Thereby, the wafer W enters a state illustrated in FIGS. 25A and 25B, for example. FIG. 25A is a view illustrating an example of the method of manufacturing a semiconductor device according to the second embodiment. FIG. 25A is a top view of the wafer W on which the conductive film 20 is formed. FIG. 25B is a cross-sectional view taken along line A-A' of the wafer W illustrated in FIG. 25A.

Figure 26A:
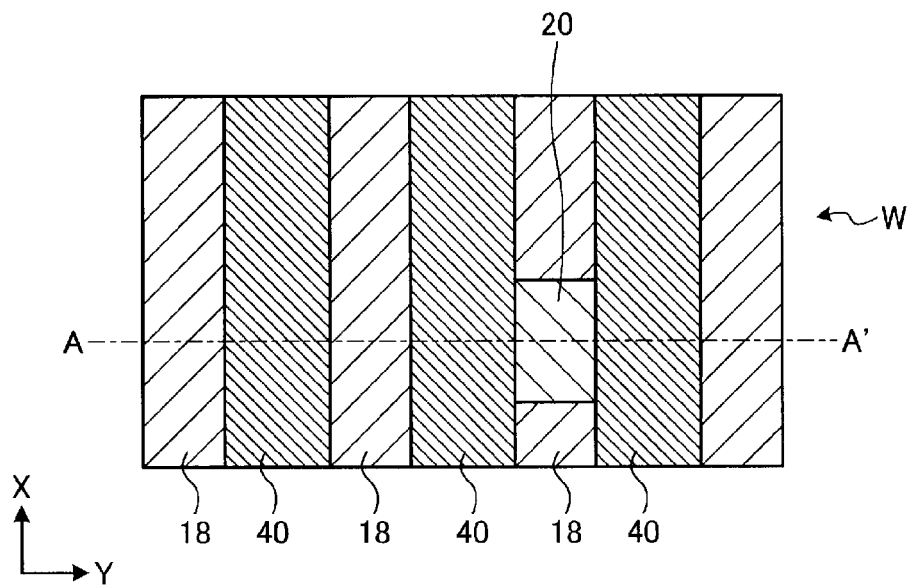
FIG. 26A is a view illustrating an example of the method of manufacturing a semiconductor device according to the second embodiment.
Figure 26B:
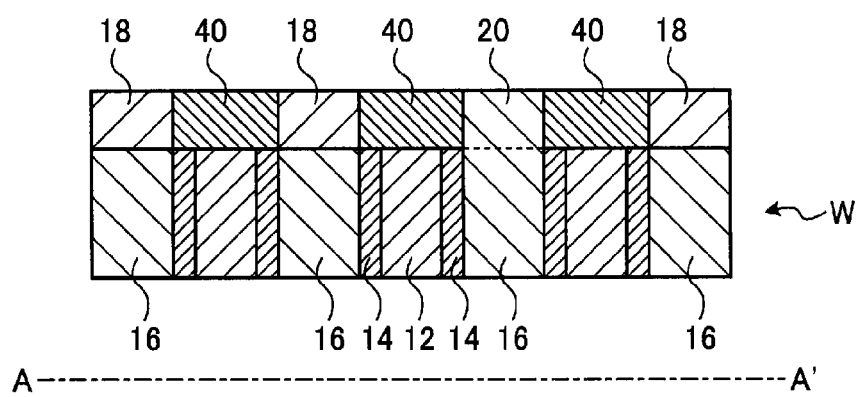
FIG. 26B is a cross-sectional view taken along line A-A' of the wafer illustrated in FIG. 26A.

Next, the silicon oxide film 18 is polished such that the upper surface of the insulation film 40 is exposed (step S58). For example, the silicon oxide film 18 is polished by CMP or the like until the upper surface of the insulation film 40 is exposed. Thereby, for example, as illustrated in FIGS. 26A and 26B, the wafer W is in a state where the upper surface of the conductive film 20 and the upper surface of the insulation film 40 are exposed. FIG. 26A is a view illustrating an example of the method of manufacturing a semiconductor device according to the second embodiment. FIG. 26A is a top view of the wafer W on which the silicon oxide film 18 is polished. FIG. 26B is a cross-sectional view taken along line A-A' of the wafer W illustrated in FIG. 26A.

Figure 27A:
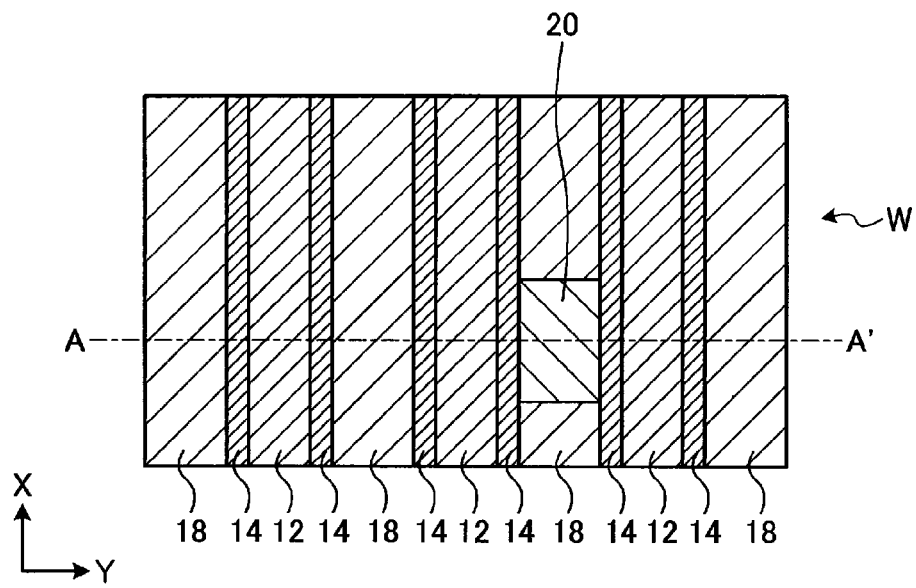
FIG. 27A is a view illustrating an example of the method of manufacturing a semiconductor device according to the second embodiment.
Figure 27B:
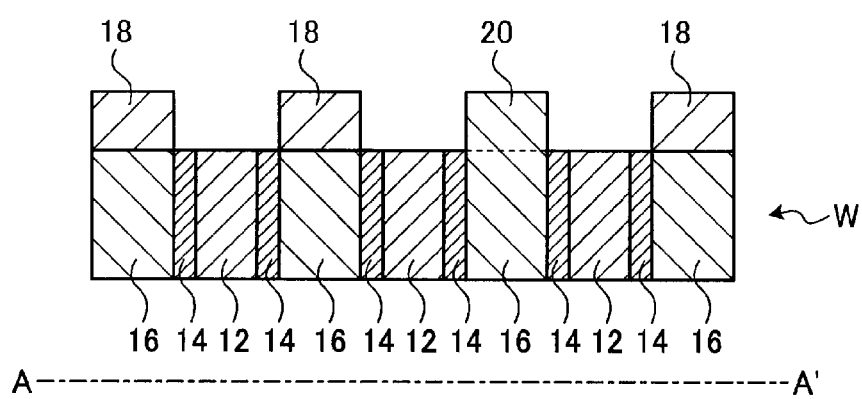
FIG. 27B is a cross-sectional view taken along line A-A' of the wafer illustrated in FIG. 27A.

Next, the exposed insulation film 40 is removed (step S59). For example, the insulation film 40 is etched through dry etching or the like using a mixed gas including a gas that includes fluorine and a gas that includes oxygen. Thereby, the wafer W enters a state illustrated in FIGS. 27A and 27B, for example. FIG. 27A is a view illustrating an example of the method of manufacturing a semiconductor device according to the second embodiment. FIG. 27A is a top view of the wafer W from which the exposed insulation film 40 is removed. FIG. 27B is a cross-sectional view taken along line A-A' of the wafer W illustrated in FIG. 27A. Removal of the insulation film 40 exposes the conductive film 12 formed on the lower layer of the insulation film 40.

Figure 28A:
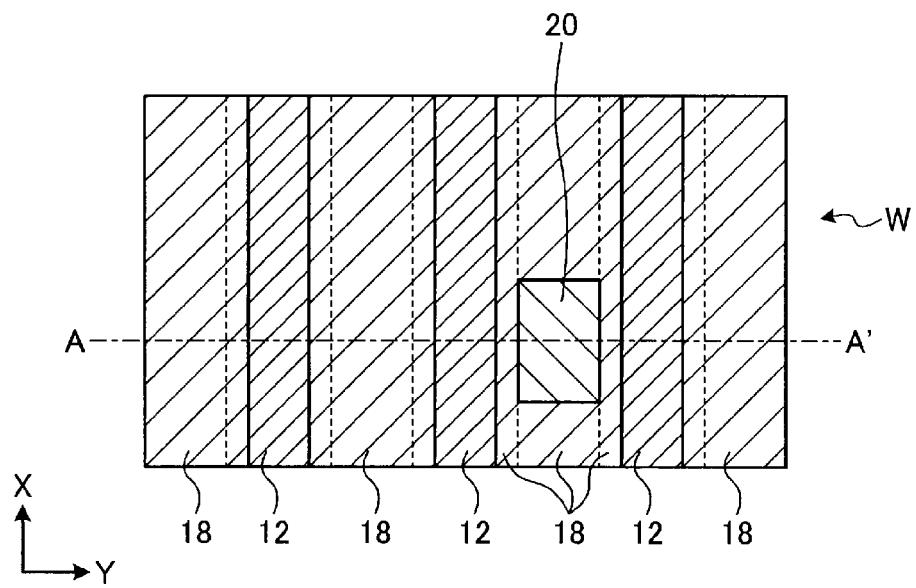
FIG. 28A is a view illustrating an example of the method of manufacturing a semiconductor device according to the second embodiment.
Figure 28B:
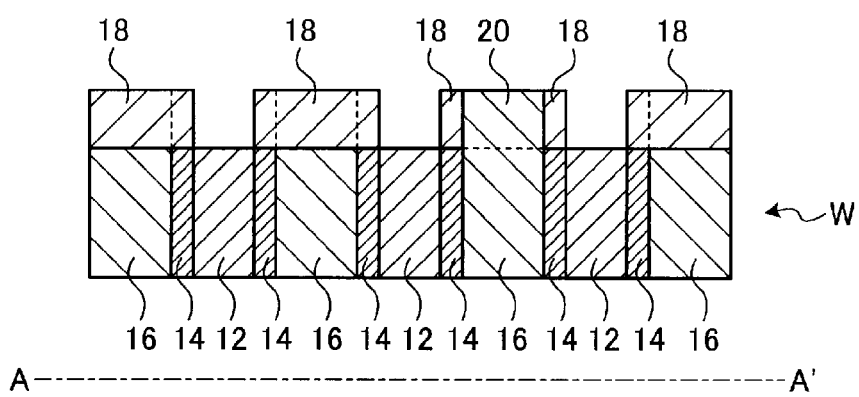
FIG. 28B is a cross-sectional view taken along line A-A' of the wafer illustrated in FIG. 28A.

Next, a width of the silicon oxide film 18 is changed to be wider to cover the upper surface of the spacer 14 (step S60). For example, a silicon oxide film of the same type as the silicon oxide film 18 is formed on the entire surfaces of the spacer 14, the conductive film 12, the silicon oxide film 18, and the conductive film 20 by CVD or coating, and the width of the silicon oxide film 18 is changed to be wider by etching back the silicon oxide film. Thereby, the wafer W enters a state illustrated in FIGS. 28A and 28B, for example. FIG. 28A is a view illustrating an example of the method of manufacturing a semiconductor device according to the second embodiment. FIG. 28A is a top view of the wafer W in which the width of the silicon oxide film 18 is changed to be wider. FIG. 28B is a cross-sectional view taken along line A-A' of the wafer W illustrated in FIG. 28A. The silicon oxide film 18 has a large width to cover the upper surface of the spacer 14.

Figure 29A:
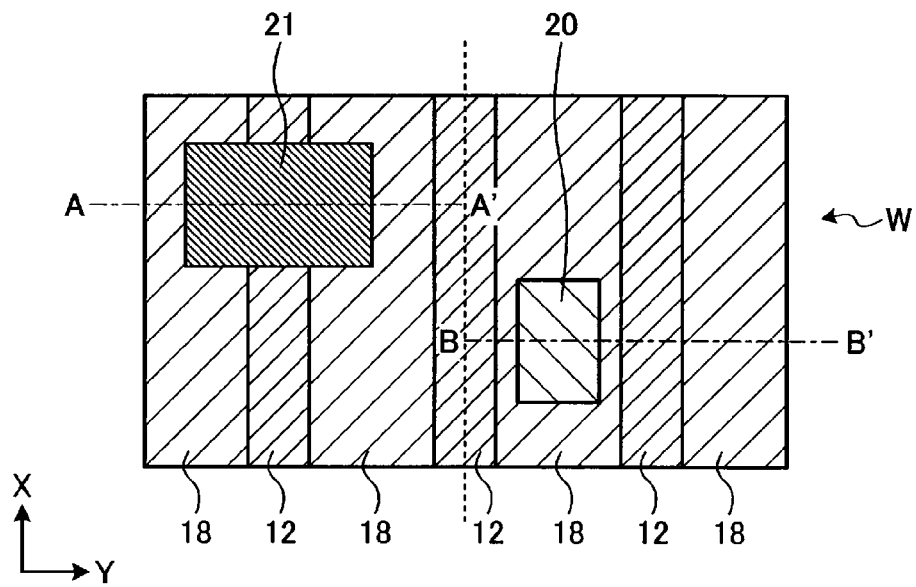
FIG. 29A is a view illustrating an example of the method of manufacturing a semiconductor device according to the second embodiment.
Figure 29B:
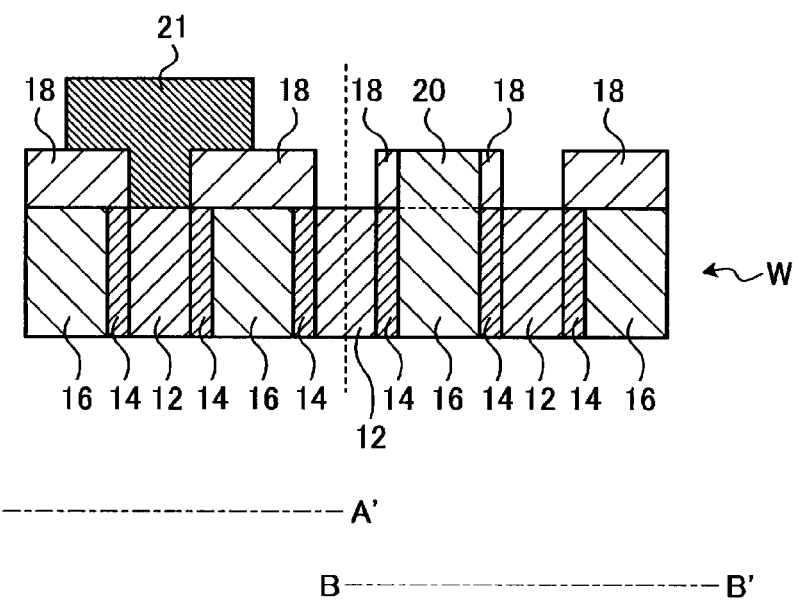
FIG. 29B is a cross-sectional view taken along lines A-A' and B-B' of the wafer illustrated in FIG. 29A.

Next, a carbon-containing film 21 is formed on the silicon oxide film 18 and the conductive film 12 (step S61). For example, the film 21 is formed at a position where a contact is formed between the silicon oxide film 18 and the gate electrode of the FET on the conductive film 12. For example, a film is formed on the entire surfaces of the silicon oxide film 18 and the conductive film 12 by a carbon-containing hard mask or resist. Then, a mask film is formed on the formed film, and a pattern is formed in the mask film by photolithography such that the mask film remains in the region where the contact with the conductive film 12 is to be formed. Then, patterning is performed using the mask film as a mask, and the film 21 is formed at a position where a contact is to be formed. Thereby, the wafer W enters a state illustrated in FIGS. 29A and 29B, for example. FIG. 29A is a view illustrating an example of the method of manufacturing a semiconductor device according to the second embodiment. FIG. 29A is a top view of the wafer W on which the carbon-containing film 21 is formed. FIG. 29B is a cross-sectional view taken along lines A-A' and B-B' of the wafer W illustrated in FIG. 29A.

Figure 30A:
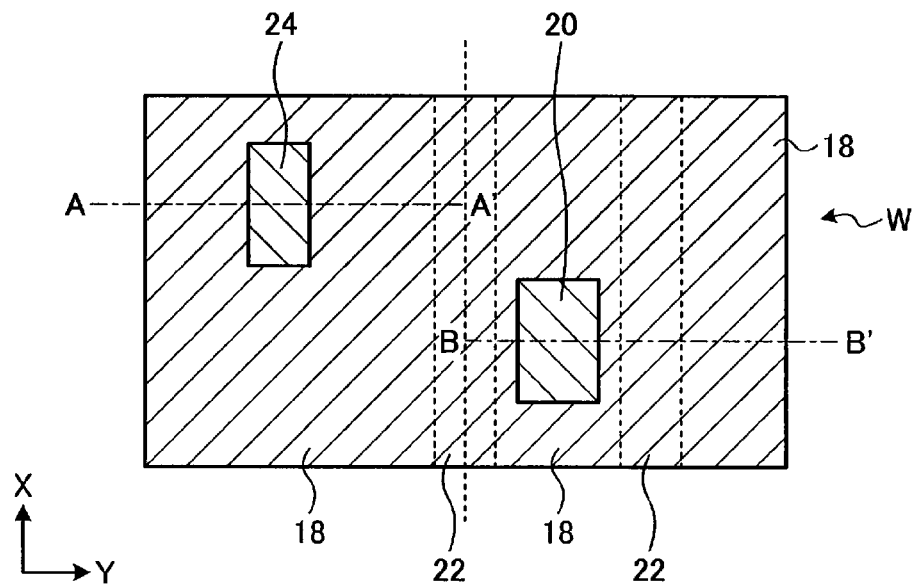
FIG. 30A is a view illustrating an example of the method of manufacturing a semiconductor device according to the second embodiment.
Figure 30B:
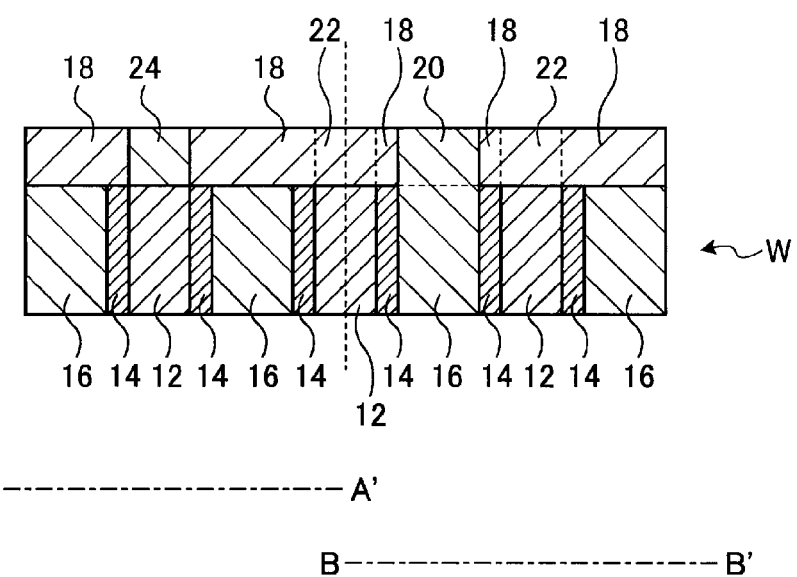
FIG. 30B is a cross-sectional view taken along lines A-A' and B-B' of the wafer illustrated in FIG. 30A.

Then, similar to the first embodiment, after the processing of steps S21 to S24 is performed to form a conductive film 24 in an opening 23 formed by removing the film 21, a silicon oxide film 22 is polished to expose the upper surfaces of the conductive films 20 and 24. Thereby, the wafer W enters a state illustrated in FIGS. 30A and 30B, for example. FIG. 30A is a view illustrating an example of the method of manufacturing a semiconductor device according to the second embodiment. FIG. 30A is a top view of the wafer W on which the silicon oxide film 22 is polished. FIG. 30B is a cross-sectional view taken along lines A-A' and B-B' of the wafer W illustrated in FIG. 30A. The portion where the conductive film 12 and the conductive film 24 are laminated functions as a contact with the gate electrode. Further, the portion where the conductive film 16 and the conductive film 20 are laminated functions as a contact with the active region. Wiring or the like for connecting the conductive film 20 and the conductive film 24 is further formed on the upper portion of the wafer W as necessary. The silicon oxide film 18 and the silicon oxide film 22 may be regarded as one silicon oxide film without being clearly distinguished from each other.

In this way, even in the method of manufacturing a semiconductor device according to the second embodiment, the openings 19 and 23 can be formed by removing the films 17 and 21. Thereby, in the method of manufacturing a semiconductor device according to the second embodiment, a via connected to a gate electrode or a via connected to a trench contact can be formed by etching having a sufficiently large selectivity. Further, in the method of manufacturing a semiconductor device according to the second embodiment, it is possible to suppress the occurrence of a short circuit when a via connected to a gate electrode or a via connected to a trench contact is formed.

Further, in the method of manufacturing a semiconductor device according to the second embodiment, by using the selective growth of the insulation film 40 on the metal, a complicated step of forming a cap film on the gate electrode can be omitted.

In this way, in the method of manufacturing a semiconductor device according to the second embodiment, the insulation film 40 is formed on the upper portion of the conductive film 12. Thereby, in the method of manufacturing a semiconductor device, a complicated step of forming a cap film on the gate electrode can be omitted.

According to the present disclosure, it is possible to suppress the occurrence of the short circuit.

While embodiments have been described above, the embodiments disclosed herein are illustrative and should not be construed as limiting in all aspects. Indeed, the embodiments described above may be embodied in various forms. The embodiments described above may be omitted, replaced, or modified in various forms without departing from the scope and spirit of the claims.

What is claimed is:

1. A method of manufacturing a semiconductor device comprising:
   forming a first film containing carbon over a silicon nitride film and a first conductive film;
   forming a first silicon oxide film surrounding the first film over the silicon nitride film and the first conductive film;
   removing the first film to form, in the first silicon oxide film, a first opening that exposes at least a part of the silicon nitride film and at least a part of the first conductive film; and
   forming a second conductive film on and in contact with the first conductive film in the first opening.

2. The method of manufacturing a semiconductor device according to claim 1, further comprising:
   polishing the first silicon oxide film such that upper surfaces of the second conductive film and the silicon nitride film are exposed;
   removing the exposed silicon nitride film to expose a third conductive film formed on a lower layer of the silicon nitride film;
   forming a second film containing carbon over the first silicon oxide film and the third conductive film;
   forming a second silicon oxide film surrounding the second film over the first silicon oxide film;
   removing the second film to form, in the second silicon oxide film, a second opening that exposes at least a part of the third conductive film and at least a part of the first silicon oxide film; and
   forming a fourth conductive film on and in contact with the third conductive film in the second opening.

3. The method of manufacturing a semiconductor device according to claim 2, further comprising:
   forming the silicon nitride film over an upper portion of the third conductive film,
   wherein the forming of the first film is performed after the forming of the silicon nitride film.

4. The method of manufacturing a semiconductor device according to claim 3, wherein the first conductive film and the second conductive film serve as a contact with an active region of a field effect transistor (FET) formed in a semiconductor device.

5. The method of manufacturing a semiconductor device according to claim 4, wherein an upper surface of the first conductive film is formed to be lower than an upper surface of the silicon nitride film.

6. The method of manufacturing a semiconductor device according to claim 3, wherein the third conductive film and the fourth conductive film serve as a contact with a gate of a field effect transistor (FET).

7. The method of manufacturing a semiconductor device according to claim 3, wherein an insulating spacer is provided between the first conductive film, and the silicon nitride film and the third conductive film.

8. The method of manufacturing a semiconductor device according to claim 2, wherein the third conductive film and the fourth conductive film serve as a contact with a gate of a field effect transistor (FET).

9. The method of manufacturing a semiconductor device according to claim 2, wherein an insulating spacer is provided between the first conductive film, and the silicon nitride film and the third conductive film.

10. The method of manufacturing a semiconductor device according to claim 1, wherein the first conductive film and the second conductive film serve as a contact with an active region of a field effect transistor (FET) formed in a semiconductor device.

11. The method of manufacturing a semiconductor device according to claim 1, wherein an upper surface of the first conductive film is formed to be lower than an upper surface of the silicon nitride film.

* * * * *